United States Patent
Danno et al.

(10) Patent No.: US 6,838,315 B2
(45) Date of Patent: Jan. 4, 2005

(54) SEMICONDUCTOR DEVICE MANUFACTURING METHOD WHEREIN ELECTRODE MEMBERS ARE EXPOSED FROM A MOUNTING SURFACE OF A RESIN ENCAPSULATOR

(75) Inventors: Tadatoshi Danno, Takasaki (JP); Katsuo Arai, Takasaki (JP); Ichio Shimizu, Tamamura (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 09/910,833

(22) Filed: Jul. 24, 2001

(65) Prior Publication Data

US 2002/0025607 A1 Feb. 28, 2002

(30) Foreign Application Priority Data

Aug. 30, 2000 (JP) ........................................ 2000-261355

(51) Int. Cl.[7] .......................... H01L 21/44; H01L 21/48; H01L 21/50
(52) U.S. Cl. .......................... 438/107; 438/113; 438/127
(58) Field of Search ................................. 438/102, 109, 438/110, 113, 118, 127

(56) References Cited

U.S. PATENT DOCUMENTS

| | | | | |
|---|---|---|---|---|
| 5,661,086 A | * | 8/1997 | Nakashima et al. | 257/668 |
| 5,731,231 A | * | 3/1998 | Miyajima | 438/124 |
| 5,953,589 A | * | 9/1999 | Shim et al. | 438/106 |
| 5,972,736 A | * | 10/1999 | Malladi et al. | 438/118 |
| 5,989,937 A | * | 11/1999 | Variot et al. | 438/108 |
| 5,989,939 A | * | 11/1999 | Fjelstad | 438/117 |
| 6,235,387 B1 | * | 5/2001 | Bennett et al. | 428/355 |
| 6,291,884 B1 | * | 9/2001 | Glenn et al. | 257/747 |
| 6,338,984 B2 | * | 1/2002 | Minamio et al. | 438/123 |
| 6,404,648 B1 | * | 6/2002 | Slupe et al. | 361/760 |
| 6,451,709 B1 | * | 9/2002 | Hembree | 438/759 |

FOREIGN PATENT DOCUMENTS

| | | |
|---|---|---|
| JP | 11-274195 | 10/1999 |
| JP | 11-330343 | 11/1999 |

* cited by examiner

*Primary Examiner*—George Fourson
*Assistant Examiner*—Fernando L. Toledo
(74) *Attorney, Agent, or Firm*—Mattingly, Stanger & Malur, P.C.

(57) ABSTRACT

A method of manufacturing a semiconductor device comprises a step of preparing a substrate in which a plurality of electrode members are individually placed on one main surface thereof in separated form, a step of placing a semiconductor chip on the one main surface of the substrate and electrically connecting a plurality of electrodes formed on one main surface of the semiconductor chip and the plurality of electrode members respectively, a step of forming a resin encapsulater for sealing the semiconductor chip and the plurality of electrode members on the one main surface of the substrate, and a step of separating the semiconductor chip and the plurality of electrode members from the substrate together with the resin encapsulater.

8 Claims, 24 Drawing Sheets

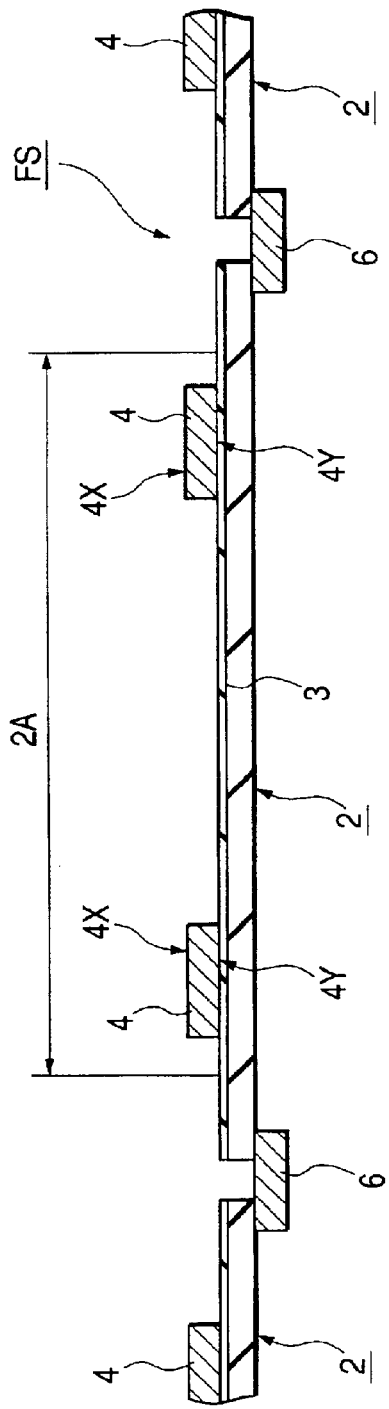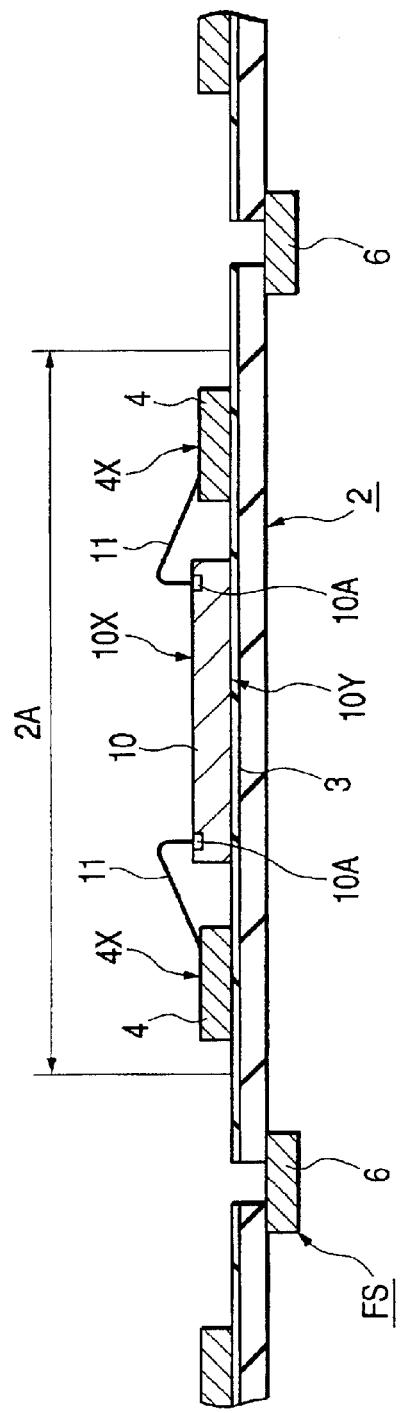

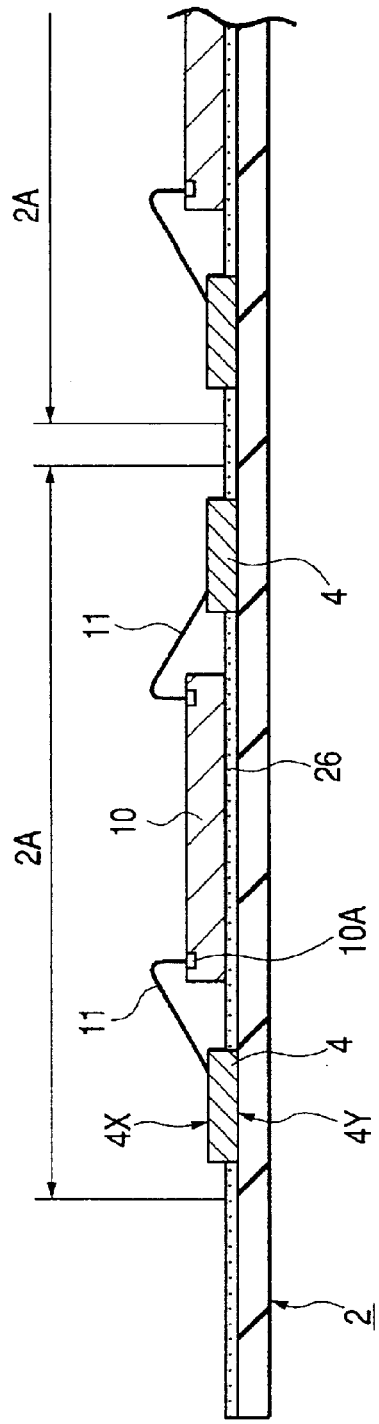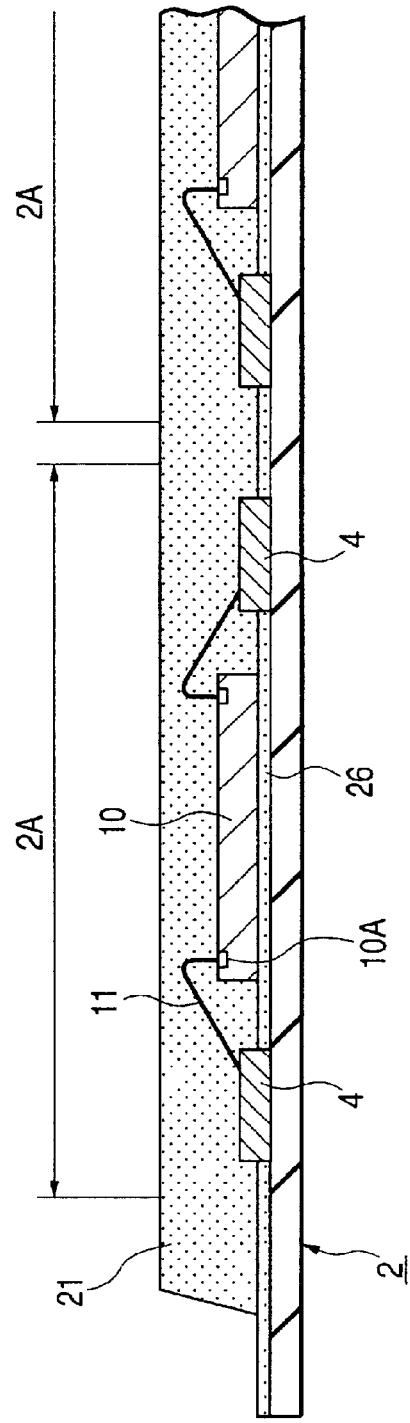

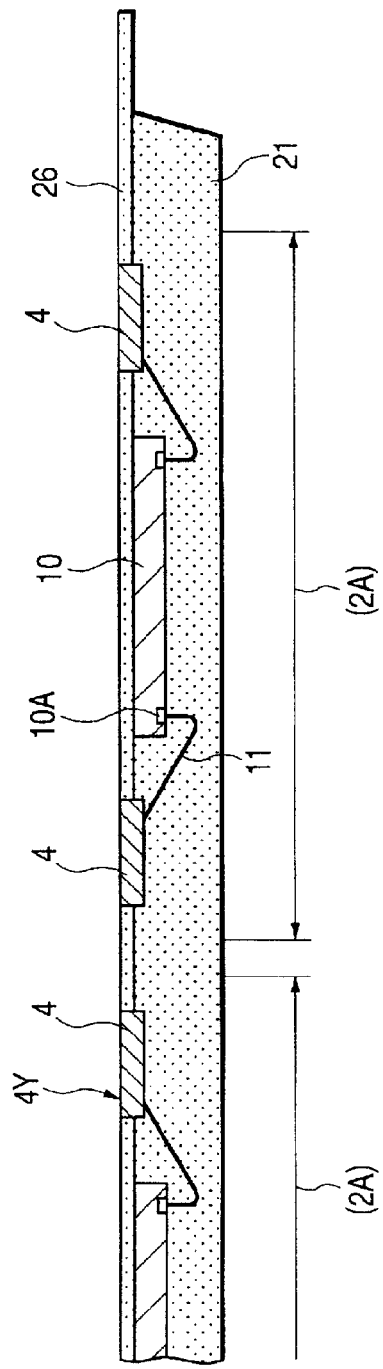
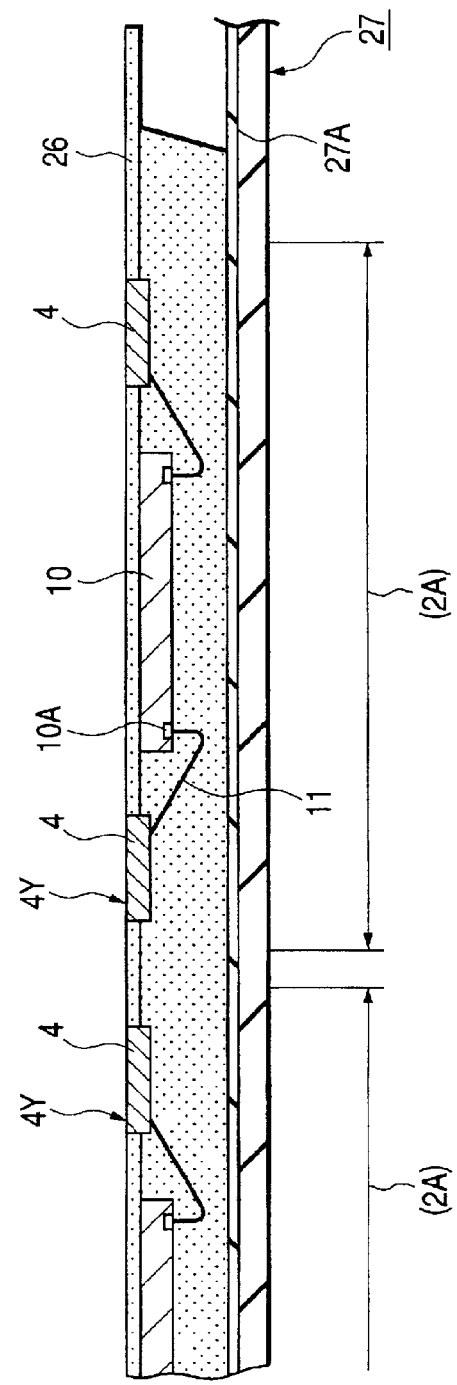
FIG. 19(A)
FIG. 19(B)

SEMICONDUCTOR DEVICE MANUFACTURING METHOD WHEREIN ELECTRODE MEMBERS ARE EXPOSED FROM A MOUNTING SURFACE OF A RESIN ENCAPSULATOR

FIELD OF THE INVENTION

The present invention relates to a semiconductor device and a manufacturing technology thereof, and particularly to a technology effective for application to the manufacture of a semiconductor device wherein electrode members are exposed from a mounting surface of a resin encapsulater.

BACKGROUND OF THE INVENTION

Various package-structure type semiconductor devices have been proposed and brought to the commercial stage as semiconductor devices each of which seals a semiconductor chip with a resin encapsulater. For instance, Unexamined Patent Publication No. Hei 11(1999)-330343 discloses a semiconductor device called a "QFN (Quad Flatpack Non-Leaded Package) type". Since the QFN type semiconductor device takes a package structure wherein electrode members (leads) electrically connected to their corresponding electrodes of a semiconductor chip are exposed from a mounting surface of a resin encapsulater, the semiconductor device can be reduced in planar size as compared with a semiconductor device called a "package structure, e.g., a QFP (Quad Flatpack Package) type" wherein leads electrically connected to electrodes of a semiconductor chip protrude from sides of a resin encapsulater.

The QFN type semiconductor device is manufactured according to an assembly process using a lead frame. When it is of a package structure wherein a semiconductor chip is placed on a die pad, for example, a die pad (also called a tub) formed integrally with a frame main body (frame body) of a lead frame through suspension leads is principally loaded with a semiconductor chip. Thereafter, electrodes (bonding pads) of the semiconductor chip, and electrode members formed integrally with the frame body of the lead frame are electrically connected to one another by bonding wires. Afterwards, the semiconductor chip, the electrode members, the die pad, the suspension leads and the bonding wires, etc. are sealed with a resin encapsulater. Subsequently, the electrode members and the suspension leads are cut and separated from the frame body of the lead frame, whereby the semiconductor device is fabricated. One ends of the bonding wires are connected to their corresponding electrodes of the semiconductor chip, whereas each of the other ends thereof is connected to its corresponding internal connecting surface (one main surface) of both the internal connecting surface and an external connecting surface (other main surface) opposite to each other, of each electrode member. The external connecting surfaces of the electrode members are exposed from a mounting surface of both an upper surface (one main surface) and the mounting surface (other main surface) opposite to each other, of the resin encapsulater.

The resin encapsulater of the QFN type semiconductor device is formed by a transfer molding method suitable for mass production. The formation of the resin encapsulater by the transfer molding method is carried out as follows: A lead frame is positioned between an upper mold and a lower mold of a molding die so that a semiconductor chip, electrode members, a die pad, suspension leads and bonding wires, etc. are located inside a cavity defined by the upper and lower molds thereof. Thereafter, a resin is injected under pressure into the cavity defined in the molding die, whereby the corresponding resin encapsulater is formed.

While the package structure wherein the external connecting surfaces of the electrode members are exposed from the mounting surface of the resin encapsulater, is obtained by positioning the lead frame to the molding die so that the electrode members contact the lower mold of the molding die and thereafter injecting the resin into the cavity of the molding die under pressure. In this case, however, the package structure is easy to cause a problem in that since the adhesion between the lower mold and each electrode member inside the cavity is low, the resin is apt to enter between the lower mold and the electrode member, and the mounting surface of each electrode member is covered with a thin-film unnecessary resin body (resin burrs).

Thus, the technology (hereinafter "sheet mold technology") of interposing a resin sheet (resin film) between the lower mold of the molding die and the lead frame, positioning the lead frame to the molding die so that the resin sheet makes contact with each electrode member, and thereafter injecting the resin into the cavity of the molding die under pressure has generally been adopted upon the manufacture of the QFN type semiconductor device. Since the adhesion between the resin sheet and each electrode member lying inside the cavity is high in the case of the present sheet mold technology, the sheet mold technology is capable of restraining the occurrence of the problem that the mounting surface of each electrode member is covered with the resin burrs. The sheet mold technology has been disclosed in Unexamined Patent Publication No. Hei 11(1999)-274195, for example.

SUMMARY OF THE INVENTION

However, the present inventors have found the following problems as a result of discussions on the manufacture of the QFN type semiconductor.

FIGS. 23 through 25 are respectively typical cross-sectional views for describing a resin encapsulater forming process step (sealing process step) at the manufacture of the conventional QFN type semiconductor device. FIGS. 26 through 28 are respectively typical cross-sectional views for describing a cutting step subsequent to the sealing step at the manufacture of the conventional QFN type semiconductor device. Incidentally, FIGS. 23 and 26 are respectively cross-sectional views cut at parts of electrode members, FIGS. 24 and 27 are respectively cross-sectional views cut at a portion between the electrode members, and FIGS. 25 and 28 are respectively cross-sectional views taken along the direction of an arrangement of the electrode members.

In FIGS. 23 through 28, reference numerals 40, 40A, 40B, 41, 42, 43, 44, 45, 46, 47, 48, 49, 50, 51, 52, 53, and 54 indicate a molding die, an upper mold, a lower mold, a cavity, a frame body, electrode members, a die pad (also called a tub), a semiconductor chip, a bonding wire, a resin encapsulater, in-dam resins, a resin sheet, a cutting die, punch guides, a cut punch, a receiving table, and a gap, respectively.

The formation of the resin encapsulater 47 by the sheet mold technology is as follows: As shown in FIG. 23, the resin sheet 49 is interposed between the lower mold 40B of the molding die 40 and a lead frame. The lead frame is positioned to the molding die 40 so that the electrode member 43 is brought into contact with the resin sheet 49. Thereafter, a resin is injected into the cavity 41 of the molding die 40 under pressure. In the present resin encapsulater forming step, the frame body 42, a connecting portion of the electrode member 43 coupled to the frame body 42, and the resin sheet 49 are pressed or clamped by a clamp surface of the upper mold 40A and a clamp surface of the lower mold 40B, whereby the leads frame is fixed to the molding die 40. Therefore, a clamping portion (corresponding to a portion opposite to the frame body 42 and the electrode member 43) of the resin sheet 49 is crushed by a clamping force, so that the thickness of the clamping portion of the resin sheet 49 becomes thinner than that of an electrode-to-electrode portion (corresponding to a portion between the electrode members 43). Since the resin is injected into the cavity 41 under pressure in such a state, the thicknesses of unnecessary resin bodies (in-dam resins 48), which protrude from the side of the resin encapsulater 47 to the frame body 42, becomes thinner than that of each electrode member 43 between the electrode members 43 (between the clamp surface of the upper mold 40A and the clamp surface of the lower mold 40B) located outside the cavity 41 as shown in FIGS. 24 and 25.

On the other hand, in a manufacturing process using the lead frame, a cutting step for cutting and separating electrode members and suspension leads, etc. from a frame body of a lead frame is executed after the formation of a resin encapsulater. In the sheet mold technology, the lead frame is taken out from the molding die, and thereafter a resin sheet with the lead frame bonded thereto is peeled away therefrom, followed by execution of a cutting step. Each of the electrode members 43 is cut and separated as follows: A basal portion of a lead-out portion of the electrode member 43, which has led out from the side of the resin encapsulater 47 to the outside, and a connecting portion coupled to the frame body 42 are clamped or pressed by the punch guides 51 of the cutting die 50 and the receiving table 53 from the upward and downward directions as shown in FIG. 26. Thereafter, the shearing action of the cut punch 52 lowered toward the receiving table 53 from the punch guides 51, and the receiving table 53 is performed to thereby carry out its cutting and separation. While each in-dam resin 48 is also cut together with the cutting of the electrode member 43 at this time, the thickness of the in-dam resin 48 becomes thinner that that of the electrode member 43 due to the above-described crushing of the resin sheet 49. Therefore, gaps are defined between the in-dam resins 48 and the receiving table 53 as shown in FIGS. 27 and 28. When the electrode member 43 is cut in a state in which such gaps 54 are defined therebetween, the receiving table 53 cannot catch or accept the in-dam resins 48. Therefore, a bending stress acts on the basal portion of the in-dam resin 48 connected to the resin encapsulater 47, so that a crack occurs so as to extend from the basal portion of the in-dam resin 48 to the resin encapsulater 47, and defects such as chip-off of the resin encapsulater 47, etc. are apt to occur. Since such problems lead to a reduction in production yield of a semiconductor device, a novel manufacturing technology is needed.

Since the receiving table 53 cannot receive or support the in-dam resins 48, the cut failure that punch-out remainders of the in-dam resins 48 remain in a state of hanging down without being perfectly separated from the resin encapsulater 47, is apt to take place. The occurrence of such a cut failure would lead to the problem that when the lead frame is removed from the cutting die 50, the punch-out remainders of the in-dam resins 48 fall onto the receiving table 53 of the cutting die 50, and the resin encapsulater 47 suffers damage due to the punch-out remainders dropped when the following lead frame is attached to the cutting die 50. Therefore, the production yield of the semiconductor device is reduced.

An object of the present invention is to provide a semiconductor device high in production yield.

The above, other objects and novel features of the present invention will become apparent from the description of the present specification and the accompanying drawings.

Summaries of typical ones of the inventions disclosed in the present application will be described in brief as follows:

(1) A method of manufacturing a semiconductor device comprises a step of preparing a substrate in which a plurality of electrode members are individually placed on one main surface thereof in separated form;

placing a semiconductor chip on the one main surface of the substrate and electrically connecting a plurality of electrodes formed on one main surface of the semiconductor chip and the plurality of electrode members respectively, a step of forming a resin encapsulater for sealing the semiconductor chip and the plurality of electrode members on the one main surface of the substrate, and a step of separating the semiconductor chip and the plurality of electrode members from the substrate together with the resin encapsulater.

(2) A method of manufacturing a semiconductor device comprises a step of preparing a substrate having a nip-holding area and a resin encapsulater forming area surrounded by the nip-holding area both provided on one main surface thereof and having a plurality of electrode members individually placed in the resin encapsulater forming area in separated form, a step of placing a semiconductor chip on the resin encapsulater forming area of the one main surface of the substrate and electrically connecting a plurality of electrodes formed on one main surface of the semiconductor chip and the plurality of electrode members respectively, a step of nipping the nip-holding area provided on the one main surface of the substrate by an upper mold and a lower mold of a molding die from upward and downward directions and injecting a resin into a cavity formed between the upper and lower molds of the molding die under pressure in a state in which the resin encapsulater forming area of the one main surface of the substrate, the semiconductor chip and the plurality of electrode members are placed inside the cavity, thereby forming a resin encapsulater, and a step of separating the semiconductor chip and the plurality of electrode members from the substrate together with the resin encapsulater.

(3) A method of manufacturing a semiconductor device comprises a step of preparing a substrate having a plurality of electrode members individually placed in a resin encapsulater forming area of one main surface in separated form and a resin layer which covers the one main surface except for an area in which the plurality of electrode members are placed, and is formed with a thickness thinner than that of each electrode member, a step of placing a semiconductor chip on an area for the resin layer, which is opposite to the resin encapsulater forming area of the one main surface of the substrate and electrically connecting a plurality of electrodes formed on one main surface of the semiconductor chip and the plurality of electrode members respectively, a step of forming a resin encapsulater for sealing the semiconductor chip and the plurality of electrode members within the area for the resin layer, which is opposite to the resin encapsulater forming area of the one main surface of the substrate, and a step of separating the resin layer, the semiconductor chip and the plurality of electrode members from the substrate together with the resin encapsulater and thereafter removing the resin layer.

According to the above-described means, since the semiconductor device is fabricated using the substrate with the plural electrode members individually placed on one main surface in separated form, the cutting step (corresponding to the step for cutting and separating the electrode members from the frame body of the lead frame) that has heretofore been required after the formation of the resin encapsulater, becomes unnecessary. Thus, since the defects (such as the crack developed over the resin encapsulater from the basal portion of the in-dam resin, the chip-off developed in the resin encapsulater, the damage developed in the resin encapsulater, caused by the fallen punched-out remainders, etc.) produced upon the conventional cutting step due to push-crushing of the resin sheet can substantially be eliminated, the manufacturing yield of the semiconductor device can be enhanced.

BRIEF DESCRIPTION OF THE DRAWINGS

FIGS. 3(A) and 3(B) are views showing the schematic configuration of the semiconductor device illustrative of the first embodiment of the present invention, wherein FIG. 3(A) is a typical plan view showing a state in which an upper portion of a resin encapsulater is removed, and FIG. 3(B) is a typical cross-sectional view taken along line a—a of FIG. 3(A);

FIG. 5 is a typical cross-sectional view taken along line b—b of FIG. 4;

FIG. 6 is a typical cross-sectional view for describing the manufacture of the semiconductor device showing the first embodiment of the present invention;

FIGS. 11(A) and 11(B) are views showing a schematic configuration of a substrate used in the manufacture of the semiconductor device showing the second embodiment of the present invention, wherein FIG. 11(A) is a typical plan view thereof, and FIG. 11(B) is a typical cross-sectional view taken along line c—c of FIG. 11(A);

FIGS. 13(A) and 13(B) are views for describing the manufacture of the semiconductor device showing the second embodiment of the present invention, wherein FIG. 13(A) is a typical plan view thereof, and FIG. 13(B) is a typical cross-sectional view taken along line d—d of FIG. 13(A);

FIGS. 14(A) and 14(B) are views for describing the manufacture of the semiconductor device showing the second embodiment of the present invention, wherein FIG. 14(A) is a typical plan view thereof, and FIG. 14(B) is a typical cross-sectional view taken along line e—e of FIG. 14(A);

FIGS. 15(A) and 15(B) are views showing a schematic configuration of a semiconductor device illustrative of a third embodiment of the present invention, wherein FIG. 15(A) is a typical cross-sectional view thereof, and FIG. 15(B) is a typical cross-sectional view showing a part of FIG. 15(A) in an enlarged form;

FIG. 18 is a typical cross-sectional view for describing the manufacture of the semiconductor device illustrating the third embodiment of the present invention;

FIG. 19 is a typical cross-sectional view for describing the manufacture of the semiconductor device showing the third embodiment of the present invention;

FIGS. 21(A) and 21(B) are views showing a schematic configuration of another substrate used in the manufacture of the semiconductor device showing the third embodiment of the present invention, wherein FIG. 21(A) is a typical plan view thereof, and FIG. 21(B) is a typical cross-sectional view taken along line g—g of FIG. 21(A);

FIGS. 22(A) and 22(B) are views showing a schematic configuration of a semiconductor device illustrative of a fourth embodiment of the present invention, wherein FIG. 22(A) is a typical plan view showing the manner of the removal of a part of a resin encapsulater, and FIG. 22(B) is a typical cross-sectional view taken along line h—h of FIG. 22(A);

DESCRIPTION OF THE PREFERRED EMBODIMENTS

Figure 1:
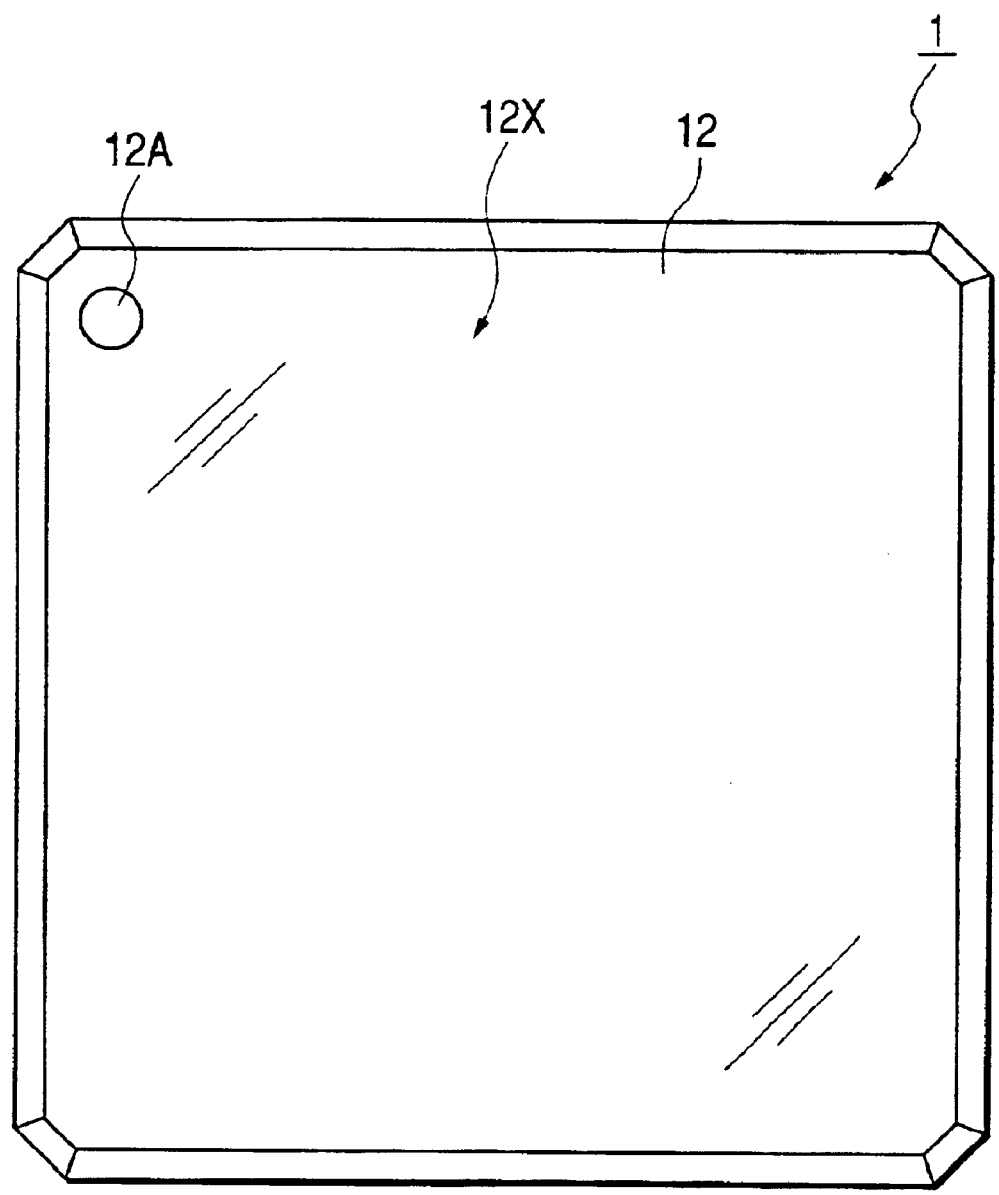
FIG. 1 is a typical plan view showing a schematic configuration of a semiconductor device illustrating a first embodiment of the present invention.

Preferred embodiments of the present invention will hereinafter be described in details with reference to the accompanying drawings. Incidentally, ones or components having the same functions in all the drawings for describing the embodiments of the invention are respectively identified by the same reference numerals, and their repetitive description will therefore be omitted.

(First Embodiment)

In the present embodiment, a description will be made of an example in which the present invention is applied to a QFN type semiconductor device.

Figure 2:
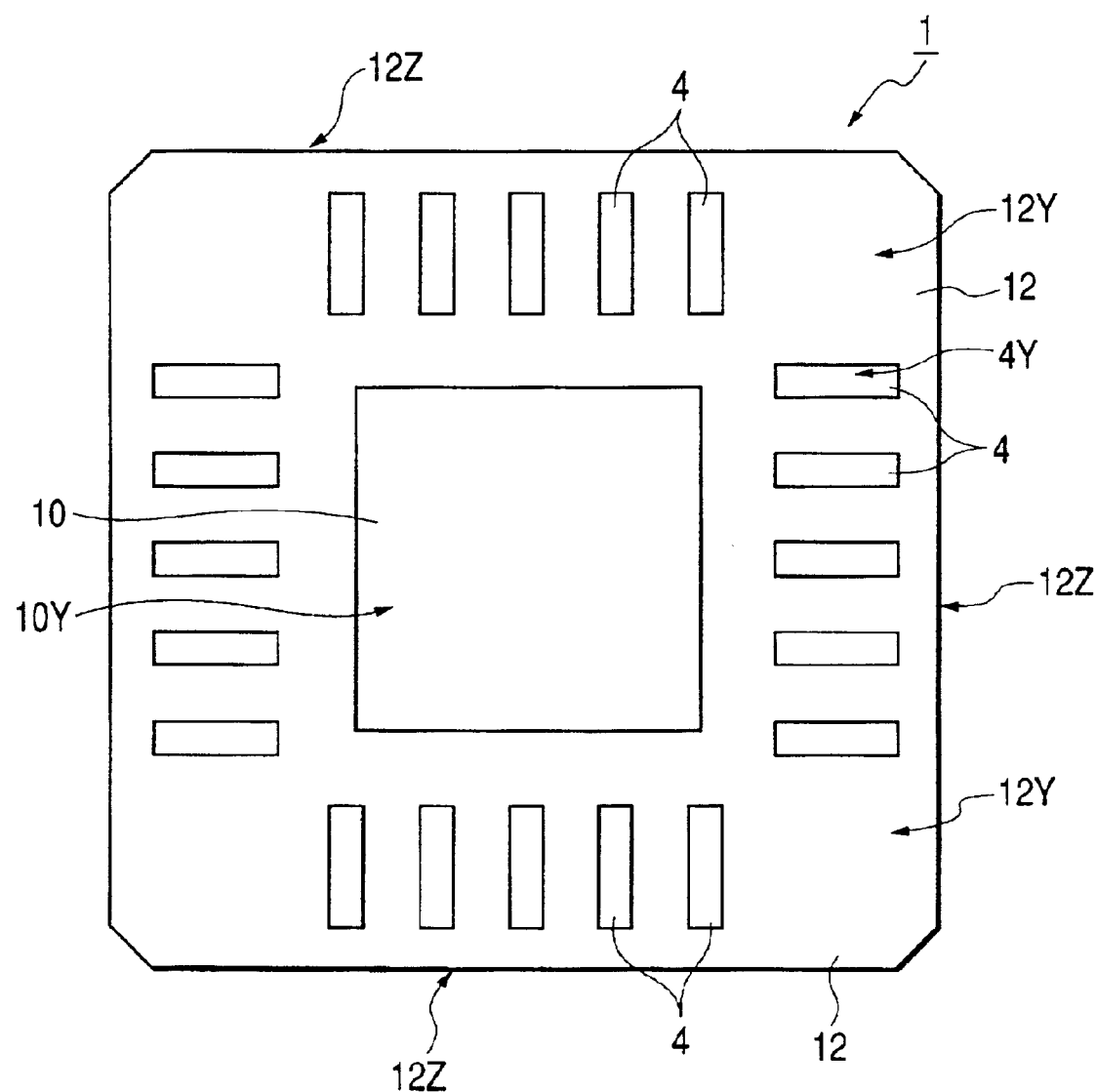
FIG. 2 is a typical bottom view illustrating the schematic configuration of the semiconductor device depicting the first embodiment of the present invention.
Figure 3A:
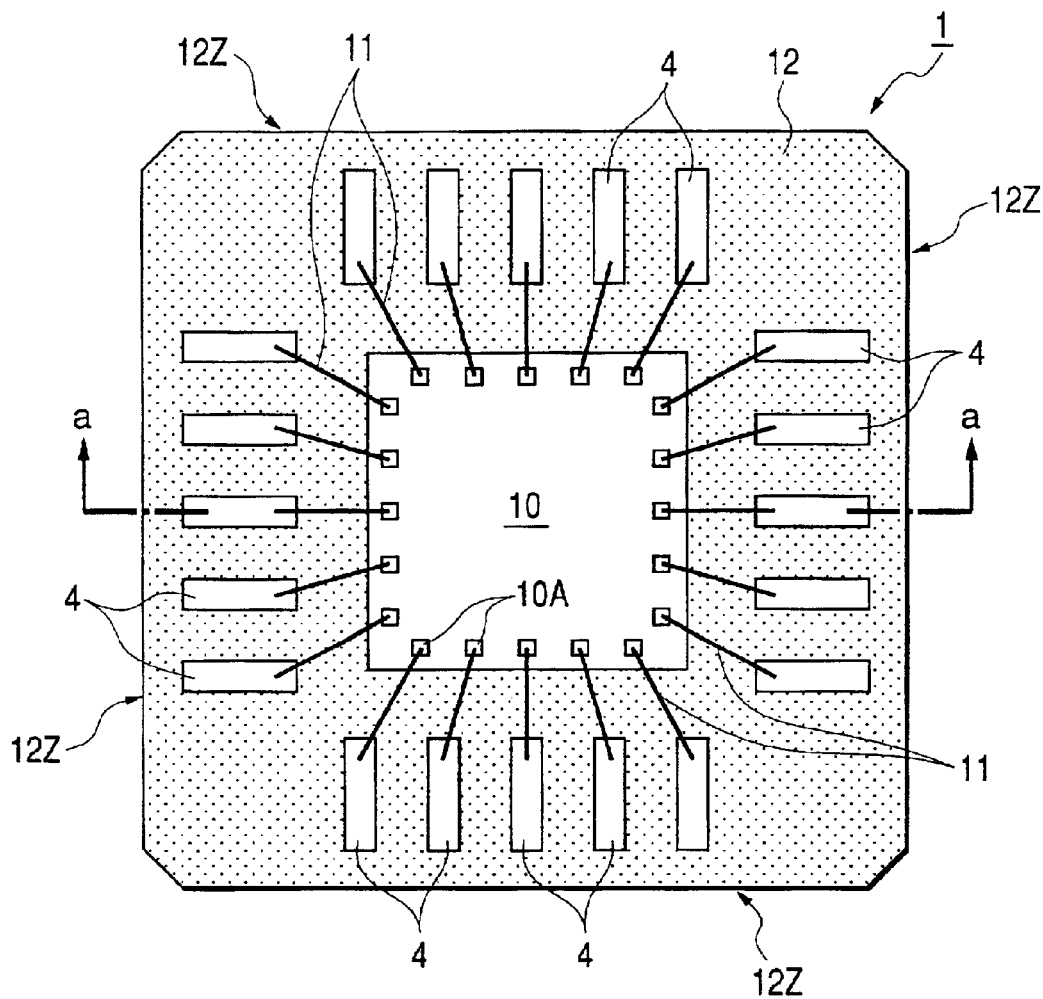
Figure 3B:
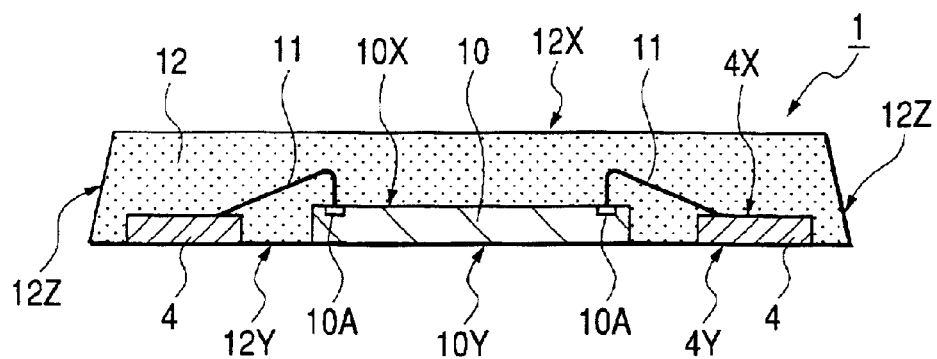

FIGS. 1 and 2 are respectively a typical plan view and a typical bottom view showing a schematic configuration of a semiconductor device illustrating the first embodiment of the present invention. FIGS. 3(A) and 3(B) are views showing the schematic configuration of the semiconductor device shown in FIG. 1, wherein FIG. 3(A) is a typical plan view showing a state in which an upper portion of a resin sealing body or encapsulater is removed, and FIG. 3(B) is a typical cross-sectional view taken along line a—a of FIG. 3(A).

As shown in FIGS. 1 through 3, a semiconductor device 1 comprises a plurality of electrode members 4, a semiconductor chip 10, a plurality of bonding wires 11 each corresponding to connecting means, and a resin sealing body or encapsulater 12, etc. The plurality of electrode members 4, the semiconductor chip 10, and the plurality of bonding wires 11 are sealed with the resin encapsulater 12.

A planar shape of the semiconductor chip 10 is represented or configured in square form. In the present embodiment, the semiconductor chip 10 is shaped in the form of a square of 2[mm]×2[mm], for example. The semiconductor chip 10 comprises a semiconductor substrate comprised of, for example, monocrystal silicon, a multilayer wiring or interconnection layer formed by piling up an insulating layer and a wiring layer in plural stages on a circuit forming surface of the semiconductor substrate, and a surface protecting film formed so as to cover the multilayer interconnection layer.

For instance, a control circuit is built in the semiconductor chip 10 as an integrated circuit. The present control circuit principally comprises transistor elements formed on the circuit forming surface of the semiconductor substrate and wirings formed in the wiring layer.

A plurality of electrodes (bonding pads) 10A are formed along the sides of the outer periphery of the semiconductor chip 10 within a circuit forming surface 10X of both the circuit forming surface (one main surface) 10X and a reverse face or back (other main surface) 10Y of the semiconductor chip 10, which are opposite to each other. The plurality of electrodes 10A are respectively formed in a wiring layer corresponding to the top layer of the mutlilayer interconnection layer of the semiconductor chip 10 and electrically connected to the transistor elements constituting the control circuit. The plurality of electrodes 10A are respectively formed of a metal film such as an aluminum (Al) film or an aluminum alloy film or the like.

A planar shape of the resin encapsulater 12 is represented or configured in square form. In the present embodiment, the resin encapsulater 12 is shaped in the form of a square of 4[mm]×4[mm], for example. The resin encapsulater 12 is formed of, for example, an epoxy thermosetting insulating resin with a phenol curing agent, silicone rubber and a filler or the like added thereto with the objective of achieving a reduction in stress. The resin encapsulater 12 employed in the present embodiment is formed by a transfer molding method suitable for mass production, for example. The transfer molding method is a method for using a molding die provided with a pot, a runner, an inflow gate, a cavity, etc. and injecting the thermosetting insulating resin into the cavity through the runner and inflow gate from the pot under the application of pressure, thereby forming a resin encapsulater.

The plurality of electrode members 4 are respectively disposed outside the outer periphery of the semiconductor chip 10 and arranged along the respective sides of the outer periphery of the resin encapsulater 12. The plurality of electrode members 4 are respectively individually separated from one another and their planar shapes are respectively shaped in the form of a rectangle, for example.

The plurality of electrode members 4 are respectively electrically connected to the plurality of electrodes 10A formed on the circuit forming surface 10X of the semiconductor chip 10 through the bonding wires 11. The bonding wires 11 have one ends connected to their corresponding electrodes 10A of the semiconductor chip 10 and the other ends connected to internal connecting surfaces 4X of both the internal connecting surfaces (one main surfaces) 4X and external connecting surfaces (other main surfaces) 4Y of the electrode members 4, which are opposite to one another. For example, gold (Au) wires are used as the bonding wires 11. As a method of connecting the bonding wires 11, for example, a ball bonding (nail head bonding) method for combining thermo compression bonding with supersonic vibration is used.

The back 10Y of the semiconductor chip 10 is exposed from a mounting surface 12Y of both an upper surface (one main surface) 12X and the mounting surface (other main surface) 12Y of the resin encapsulater 12, which are opposite to each other. Owing to such a configuration, the effect of radiating heat of the semiconductor chip 10 toward the outside of the resin encapsulater 12 is improved. It is therefore possible to improve the reliability with respect to the heat.

The respective external connecting surfaces 4Y of the plurality of electrode members 4 are exposed from the mounting surface 12Y of the resin encapsulater 12. Further, the plurality of electrode members 4 are respectively separated from the sides 12Z of the resin encapsulater 12. The electrode members 4 whose external connecting surfaces 4Y are exposed from the mounting surface 12Y of the resin encapsulater 12, are disposed so as to be separated from the sides 12Z of the resin encapsulater 12 in this way. Thus, the area in which the resin of the resin encapsulter 12 and each of the electrode member 4 contact each other, increases as compared with the case in which parts of the electrode members are exposed from the sides of the resin encapsulater. It is therefore possible to enhance the fixing strength of the electrode members 4 to the resin encapsulater 12.

An index 12A formed as a mark used when the semiconductor device is mounted onto a mounting or printed board, is formed at one of the four corners on the upper surface 12X of the resin encapsulater 12.

Incidentally, the external connecting surfaces 4Y of the electrode members 4 are located within substantially the same plane as the mounting surface 12Y of the resin encapsulater 12 in the present embodiment. The semiconductor chip 10 and each electrode member 4 are formed with a thickness of about 0.2[mm], for example. A planar form of each electrode member 4 is shaped in the form of a rectangle of about 0.2[mm]×0.6[mm], for example.

Figure 4:
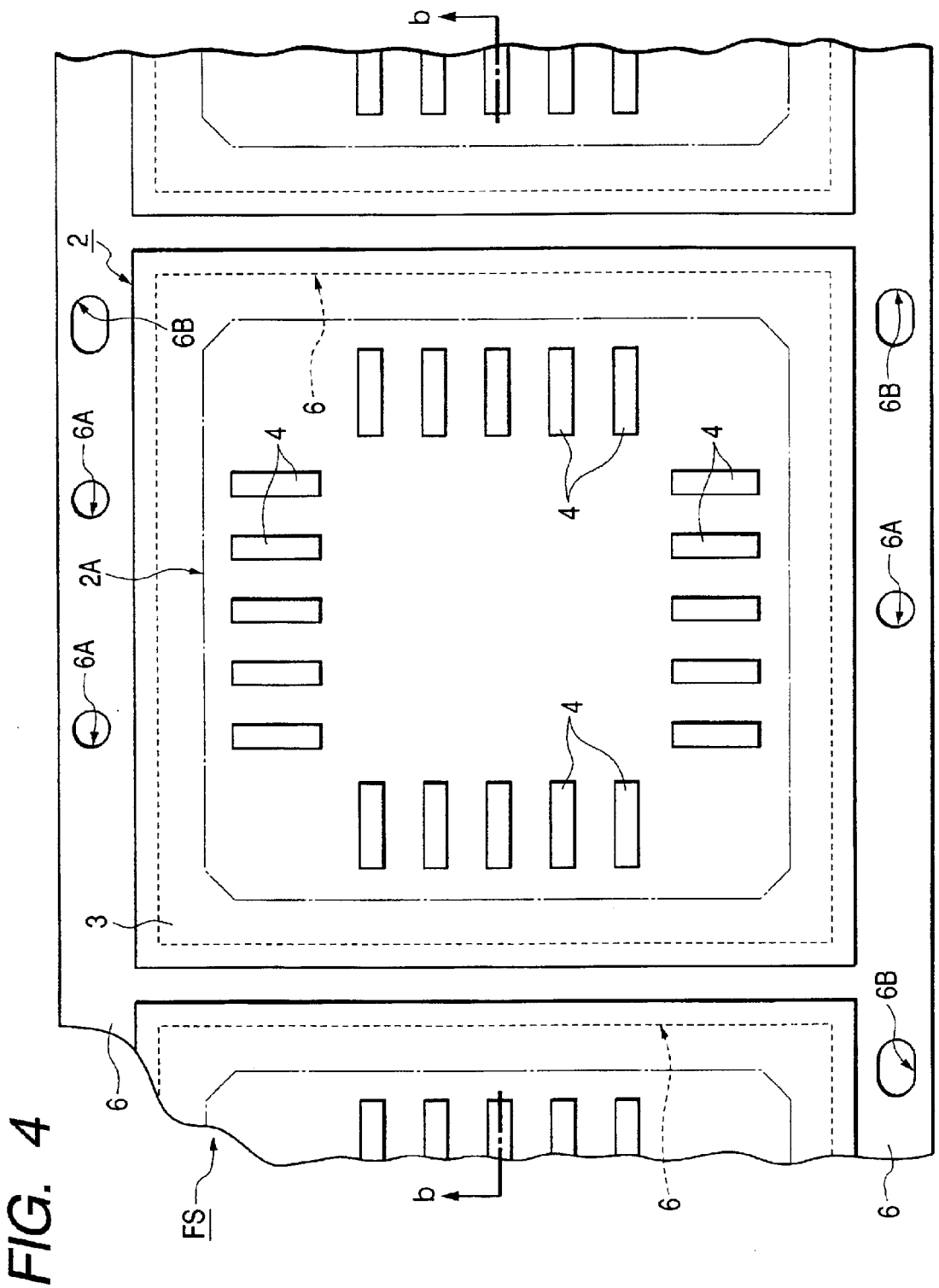
FIG. 4 is a typical plan view of a frame structure used in the manufacture of the semiconductor device showing the first embodiment of the present invention.

A frame structure employed in the manufacture of the semiconductor device 1 will next be described with reference to FIGS. 4 and 5. FIG. 4 is a typical plan view of the frame structure and FIG. 5 is a typical cross-sectional view taken along line b—b of FIG. 4, respectively.

As shown in FIGS. 4 and 5, the frame structure FS is not limited to one shown in the drawings but takes a multiple frame structure or construction wherein, for example, an area defined by a frame main body (frame body) 6 is arranged in plural form in one direction. The substrates 2 are placed within the respective areas defined by the frame bodies 6. The substrate 2 has a resin encapsulater forming area 2A for forming a resin encapsulater on the one main surface side of one main surface and other main surface both opposite to each other, and a nip-holding area (portion excluding the resin encapsulater forming area) interposed and held between an upper mold and a lower mold of a molding die when the resin encapsualter is formed based on a transfer molding method. In the present embodiment, the resin encapsulater forming area 2A is provided as one, and the nip-holding area is provided so as to surround the periphery of the resin encapsulater forming area 2A.

A chip mounting area for mounting a semiconductor chip thereon is provided in the central portion of the resin encapsulater forming area 2A. A plurality of electrode members 4 individually separated from one another are disposed at a peripheral portion which surrounds the central portion of the resin encapsulater forming area 2A, so as to surround the periphery of the chip mounting area. The plurality of electrode members 4 are respectively disposed inside the resin encapsulater forming area 2A with being separated from its peripheral edge (outermost periphery).

A planar form of the substrate 2 is shaped in the form of a square, for example, and its peripheral edge portions are bonded and fixed to the frame body 6 and supported thereby. For example, a flexible resin film having an adhesive layer 3 provided on one main surface (surface on which each electrode member 4 is placed) is used as the substrate 2. The adhesive layer 3 is provided with the objective of holding the electrode members 4 and the semiconductor chip on the substrate 2. Namely, the plurality of electrode members 4 employed in the present embodiment are fixed to the resin encapsulater forming area 2A of one main surface of the substrate 2 by the adhesive layer 3.

The electrode members 4 are not limited to the above but makes use of electrode members (pieces of metals) individually formed by subjecting a metal plate comprised of, for example, an iron (Fe)-Nickel (Ni) alloy material, or copper (Cu) or a copper alloy material to punching processing. The placement of the electrode members 4 on the substrate 2 is not limited to the above. However, the placement thereof is carried out by, for example, aligning the individually separated plural electrode members (metal pieces) in a suction jig, thereafter causing the suction jig to deliver the plurality of electrode members to the resin encapsulater forming area 2A of the one main surface of the substrate 2, and thereafter causing the suction jig to crimp the plurality of electrode members onto the resin encapsulater forming area 2A. Incidentally, a method of automatically placing the punched electrode members 4 on the substrate 2 while punching out the electrode members 4 from the metal plate.

The frame body 6 is not limited to the above but may be one formed by subjecting a metal plate comprised of, for example, a Fe—Ni alloy material or Cu, or a Cu alloy material to punching processing.

Circle holes (standard pilot holes) 6A used to movably operate the frame structure FS in the manufacturing process of the semiconductor device are provided at mutually-opposed two longitudinally-extending portions (portions in the longitudinal direction of the frame body 6) of the frame body 6. Further, long holes (pilot holes) 6B used to position the frame structure FS in the manufacturing process of the semiconductor device are provided at the two longitudinally-extending portions of the frame body 6.

Incidentally, the electrode members 4 are fixed to the substrate 2 by the adhesive layer 3. Although described later in detail, the semiconductor chip is fixed to the substrate 2 by the adhesive layer 3 in the manufacturing process of the semiconductor device. On the other hand, the resin encapsulator is formed in the resin encapsulater forming area 2A of the substrate 2 and thereafter separated from the substrate 2 together with the semiconductor chip and the electrode members 4. Accordingly, the adhesive layer 3 may preferably have adhesion equivalent to such an extent that the semiconductor chip, the electrode members 4 and the resin encapsulater are not peeled from the substrate 2 with ease at the stage of separating the resin encapsulater from the substrate 2, and have adhesion equivalent to such an extent that the semiconductor chip, the electrode members 4 and the resin encapsulater are easily peeled from the substrate in the process step of separating the resin encapsulater from the substrate 2. In the present embodiment, one having such quality of material that adhesion is lowered due to the irradiation of ultraviolet rays, for example, may be used as the adhesive layer 3.

In the present embodiment as well, the resin encapsulater 12 is formed by the transfer molding method. Accordingly, a heat-resistant flexible resin film resistant to the temperature at the formation of the resin encapsulater is used as the substrate 2.

Figure 7:
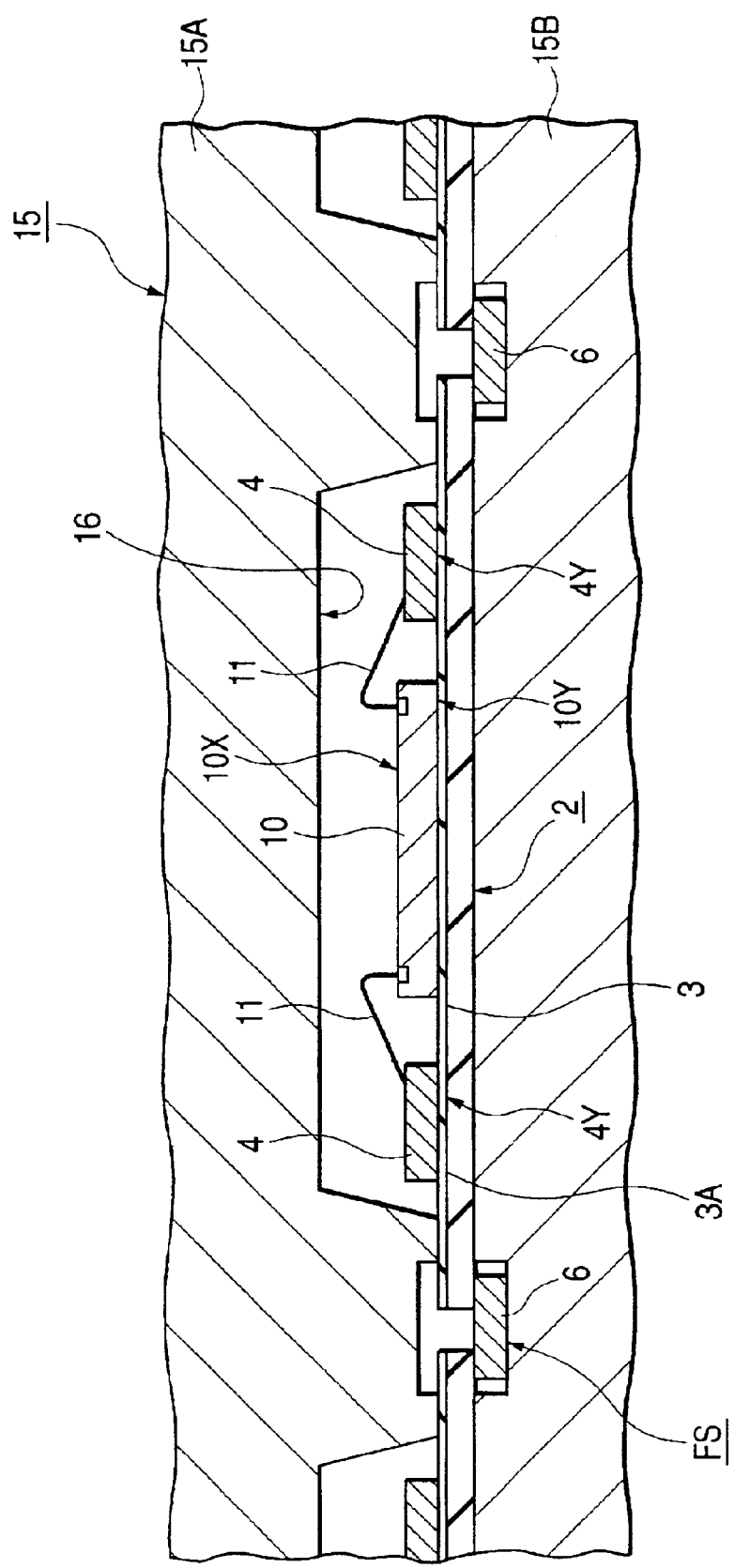
FIG. 7 is a typical cross-sectional view for describing the manufacture of the semiconductor device showing the first embodiment of the present invention.
Figure 8:
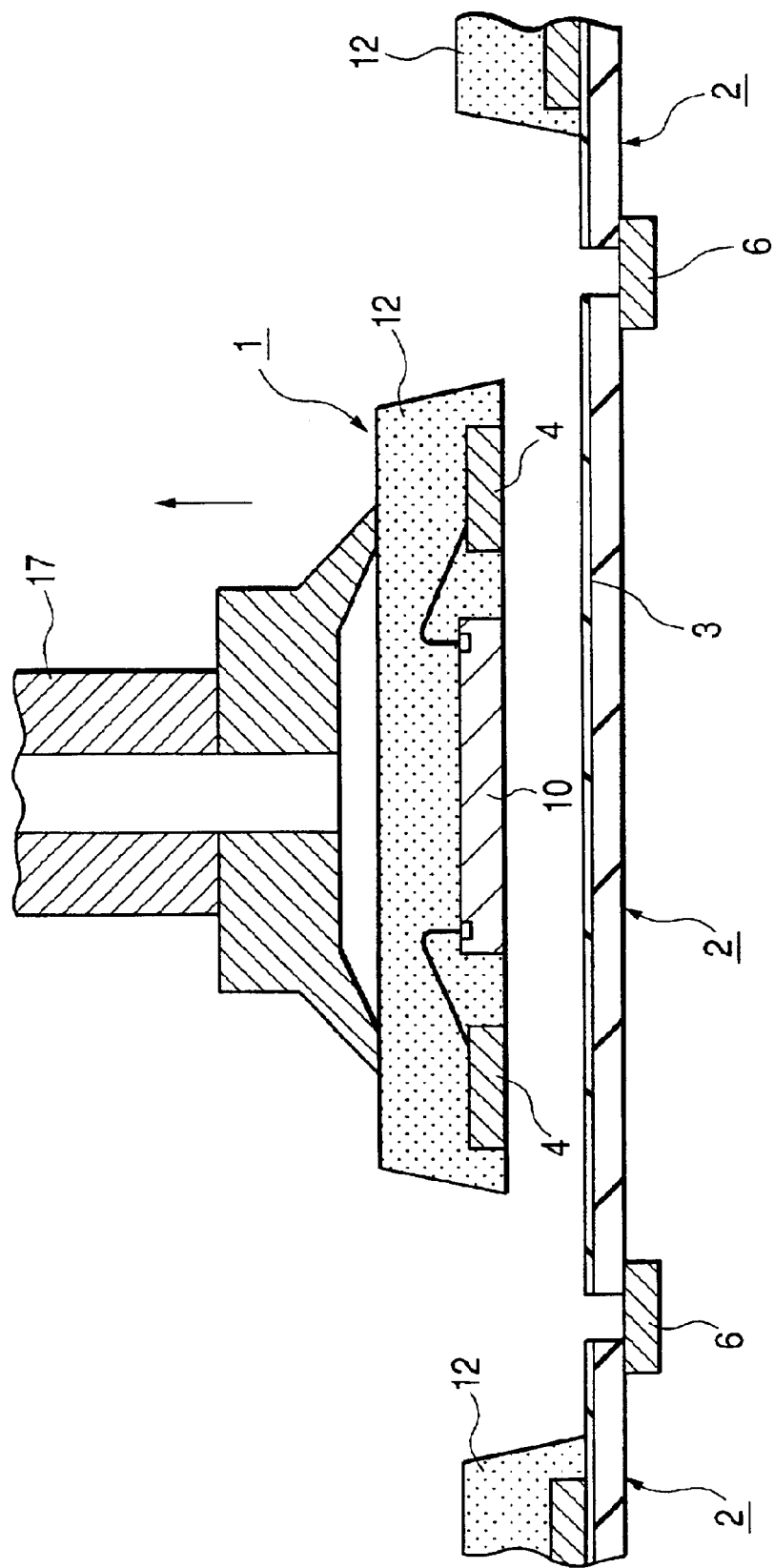
FIG. 8 is a typical cross-sectional view for describing the manufacture of the semiconductor device illustrating the first embodiment of the present invention.

The fabrication of the semiconductor device 1 will next be explained with reference to FIGS. 6 through 8. FIGS. 6 through 8 are respectively typical cross-sectional views for describing the manufacture of the semiconductor device 1.

The frame structural body or structure FS shown in FIGS. 4 and 5 is first prepared. The frame structure FS has a construction wherein a substrate 2 is provided within an area defined by a frame body 6. The substrate 2 has a resin encapsulater forming area 2A provided on one main surface. A chip mounting area is provided in the central portion of the resin encapsulater forming area 2A. A plurality of electrode members 4 individually placed in separated form are provided at a peripheral portion which surrounds the central portion of the resin encapsulater forming area 2A.

Next, the frame structure FS is conveyed to a chip bonding device, where a semiconductor chip 10 is mounted on the chip mounting area of the resin encapsulater forming area 2A of the one main surface of the substrate 2. The semiconductor chip 10 is placed thereon in a state in which the reverse side or back 10Y thereof is opposite to the substrate 2, and fixed to the substrate 2 by an adhesive layer 3.

Next, the frame structure FS is conveyed from the chip bonding device to a wire bonding device. Thereafter, a plurality of electrodes 10A of the semiconductor chip 10 and the plurality of electrode members 4 are respectively electrically connected to one another by a plurality of bonding wires 11. The bonding wires 11 have one ends electrically connected to their corresponding electrodes 10A of the semiconductor chip 10 and the other ends electrically connected to their corresponding internal connecting surfaces 4X of the electrode members 4. Process steps up to now are shown in FIG. 6.

Next, the frame structure FS is conveyed from the wire bonding device to a transfer molding device, where the frame structure FS is positioned between an upper mold 15A and a lower mold 15B of a molding die 15 as shown in FIG. 7. At this time, the resin encapsulater forming area 2A of the substrate 2, the plurality of electrode members 4, the semiconductor chip 10 and the plurality of bonding wires 11, etc., are placed inside a cavity 16 defined by the upper mold 15A and the lower mold 15B. The substrate 2 is fixed to the molding die 15 by holding down or clamping (nipping) a nip-holding area that surrounds the periphery of the resin encapsulater forming area 2A, with a clamp surface of the upper mold 15A and a clamp surface of the lower mold 15B as viewed from the upward and downward directions. Further, the frame body 6 is also fixed to the molding die 25 by being pressed or clamped with the clamp surface of the upper mold 15A and the clamp surface of the lower mold 15B as viewed from the upward and downward directions.

Since the substrate 2 employed in the present embodiment is formed of a flexible resin film in the present process step, the nipping-area portion of the substrate 2 is elastically deformed by means of a clamping force (nip-holding force) between the upper mold 15A and the lower mold 15B, and the one main surface side (corresponding to the forming surface side of the resin encapsulater) of the substrate 2 is reliably closely-bonded to the clamp surface of the upper mold 15A without any gap therebetween.

Next, a thermosetting molten resin is injected under pressure into the one main surface side of the substrate 2 lying inside the cavity 16 through a pot, a runner and a flow gate of the molding die 15 in this state to thereby form a resin encapsulater 12 in the resin encapsulater forming area 2A of the one main surface of the substrate 2. The plurality of electrode members 4, the semiconductor chip 10 and the plurality of bonding wires 11, etc., are sealed with the resin encapsulater 12.

Since the electrode members 4 and the semiconductor chip 10 are fixed to the substrate 2 by the adhesive layer 3 in this process step, the problem that the external connecting surfaces 4Y of the electrode members 4 and the back 10Y of the semiconductor chip 10 are covered with resin burrs, can be restrained from occurring.

Further, since the resin encapsulater 12 is formed without nipping the plurality of electrode members 4 with the molding die 15 in this process step, an in-dam resin formed outside the resin enapasulater 12 can be abolished.

Next, the frame structure FS is taken out from the molding die 15. Since the semiconductor device 1 according to the present embodiment is fabricated according to the manufacturing process using the substrate 2 having the plurality of electrode members 4 individually placed on the one main surface in separated form, the cutting step (corresponding to the step for cutting and separating the electrode members from the frame body of the lead frame) that has heretofore been needed after the formation of the resin encapsulater 12, becomes unnecessary. Thus, the semiconductor device 1 according to the present embodiment is substantially brought to completion owing to the formation of the resin encapsulater 12.

Thereafter, the semiconductor chip 10 and the plurality of electrode members 4 are separated from the substrate 2 together with the resin encapsulater 12, and the corresponding semiconductor device 1 is stored or held in a receiving or storage tray. They are separated from the substrate 2 by an absorption collet 17 of a pickup device as shown in FIG. 8 after ultraviolet rays are applied to lower the adhesion of the adhesive layer 3.

The semiconductor device 1 held in the storage tray is subjected to a temperature cycle test, a screening test, a marking step, etc. corresponding to environmental tests subsequent to the product completion, followed by shipment as a product. The semiconductor device 1 shipped as the product is implemented or mounted in a printed circuit board built in a small electronic apparatus such as a cellular phone, a portable information processing terminal device, a portable personal computer or the like.

According to the first embodiment, since the back 10Y of the semiconductor chip 10 is exposed from the mounting surface 12Y of the resin encapsulater 12, the effect of radiating heat of the semiconductor chip 10 toward the outside of the resin encapsulater 12 is improved. It is therefore possible to provide a QFN type semiconductor device 1 high in reliability with respect to the heat.

According to the first embodiment, since the electrode members 4 whose external connecting surfaces 4Y are exposed from the mounting surface 12Y of the resin encapsulater 12, are disposed so as to be separated from the sides 12Z of the resin encapsulater 12, the area in which the resin of the resin encapsulter 12 and each of the electrode member 4 contact each other, increases as compared with the case in which parts of the electrode members are exposed from the sides of the resin encapsulater, and hence the fixing strength of the electrode members 4 to the resin encapsulater 12 becomes high. It is thus possible to restrain the failure that the electrode members 4 are peeled off from the resin encapsulater 12 after the semiconductor device is implemented on its corresponding printed circuit board. Therefore, a QFN type semiconductor device 1 high in reliability with respect to its implementation can be provided.

According to the first embodiment, since the semiconductor device is fabricated according to the manufacturing process using the substrate 2 with the plural electrode members 4 individually placed on one main surface in separated form, the cutting step (corresponding to the step for cutting and separating the electrode members from the frame body of the lead frame) that has heretofore been required after the formation of the resin encapsulater, becomes unnecessary. Thus, since defects (such as a crack developed over the resin encapsulater from a basal portion of an in-dam resin, a chip-off developed in the resin encapsulater, damage caused in the resin encapsulater, caused by fallen punched-out remainders, etc.) produced upon the conventional cutting step due to push-crushing of a resin sheet can substantially be eliminated, a QFN type semiconductor device 1 high in production yield can be provided.

According to the first embodiment, since the substrate 2 comprised of the flexible resin film is used, the portion of the nip-holding area of the substrate 2 is elastically deformed by the clamping force (nipping force) developed between the upper mold 15A and the lower mold 15B, so that the one main surface side (corresponding to the forming surface side of resin encapsulater) of the substrate 2 can reliably be closely-bonded to the clamp surface of the upper mold 15 without any gap therebetween. Thus, since the trouble that the resin leaks to the outside from the cavity 16, can be restrained, a QFN type semiconductor device 1 high in production yield can be provided or offered.

According to the first embodiment, since the substrate 2 comprised of the flexible resin film, having the adhesive layer 3 provided over the one main surface, is used, the electrode members 4 and the semiconductor chip 10 are fixed to the substrate 2 with the adhesive layer 3. Thus, since the problem that the external connecting surfaces 4Y of the electrode members 4 and the back 10Y of the semiconductor chip 10 are covered with resin burrs, can be restrained from occurring, a QFN type semiconductor device 1 high in production yield can be provided.

According to the first embodiment, since one made up of a material reduced in adhesion according to the radiation of ultraviolet rays is used as the adhesive layer 3, the semiconductor chip 10 and the plurality of electrode members 4 can easily be separated from the substrate 2 together with the resin encapsulater 12 by the application of the ultraviolet rays to the adhesive layer 3 after the formation of the resin encapsulater 12.

According to the first embodiment, since the substrate 2 comprised of the heat-resistant flexible resin film resistant to the temperature at the formation of the resin encapsulater is used, defects such as deformation (warpage, wrinkles), etc., are not produced in the substrate 2 upon the formation of the resin encapsulater. Thus, since a reduction in flatness of the mounting surface 12Y of the resin encapsulater 12 can be restrained or suppressed, a QFN type semiconductor device 1 high in production yield can be offered.

According to the first embodiment, since the frame structure FS wherein each substrate 2 is supported by the frame body 6, is used, the conveyance property and bundling property of the substrate 2 in the manufacturing process of the semiconductor device 1 are improved. Accordingly, a QFN type semiconductor device 1 high in productivity can be provided.

While the present embodiment has described the example in which the semiconductor chip 10 and the plurality of electrode members 4 are separated from the substrate 2 together with the resin encapsulater 12 and thereafter the semiconductor device 1 is stored in the storage tray, the separation of those from the substrate 2 may be carried out immediately before the process step for mounting the semiconductor device 1 on the printed or mounting board.

While the present embodiment has also described the example in which one comprised of the material lowered in adhesion by the application of the ultraviolet rays is used as the adhesive layer 3, another one may be used as the adhesive layer 3 if one is used which has adhesion equivalent to such an extent that the semiconductor chip 10, the electrode members 4 and the resin encapsulater 12 are not peeled from the substrate 2 with ease at the stage prior to the separation of the resin encapsulater 12 from the substrate 2, and has adhesion equivalent to such an extent that the semiconductor chip 10, the electrode members 4 and the resin encapsulater 12 are easily peeled from the substrate in the process step of separating the resin encapsulater 12 from the substrate 2.

Further, while the present embodiment has described the example in which the resin encapsulater 12 is formed by the transfer molding method, the resin encapsulater 12 may be formed by a potting method or a printing method free of the use of molding.

Figure 9:
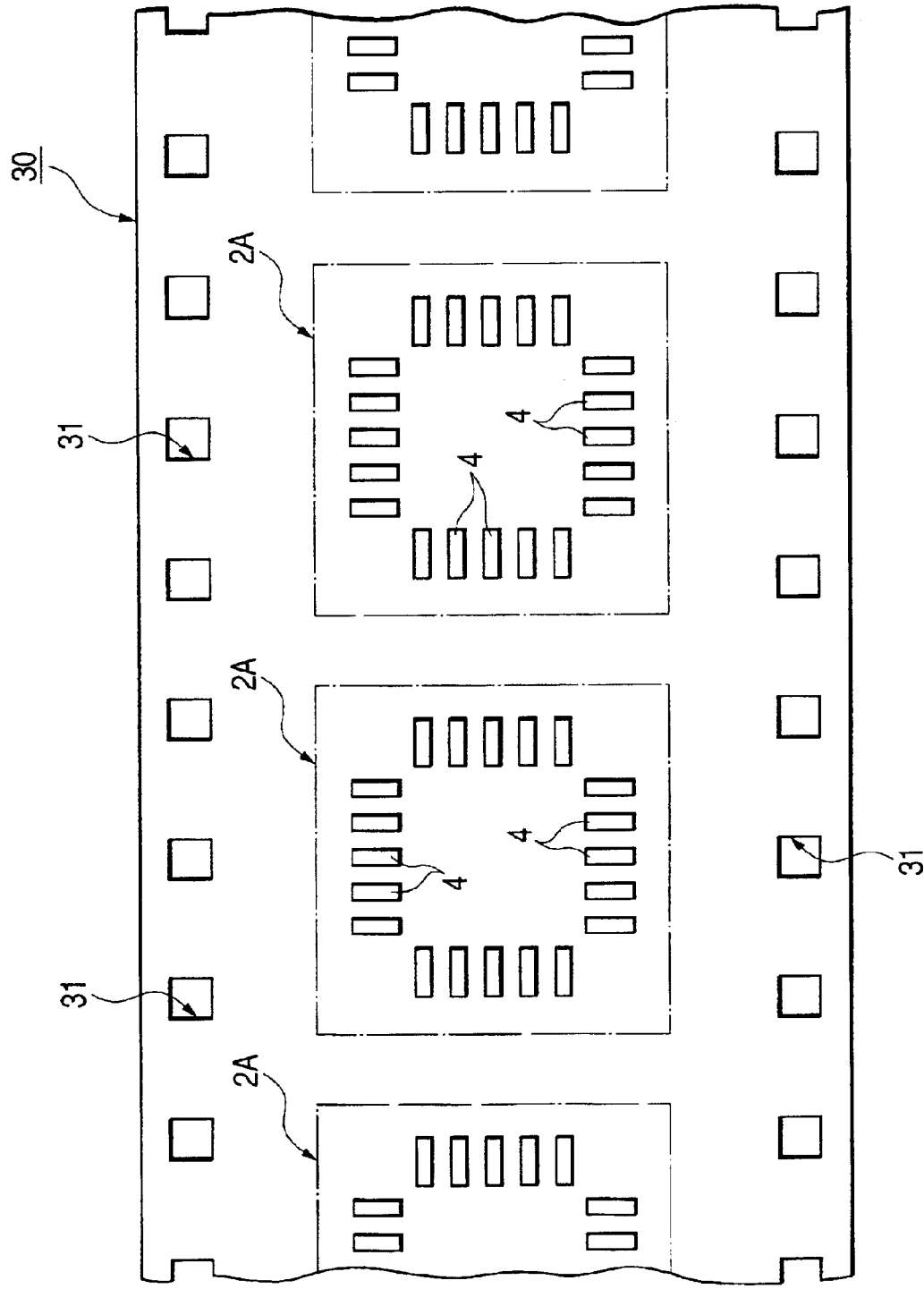
FIG. 9 is a typical cross-sectional view of a carrier tape used in the manufacture of the semiconductor device showing the first embodiment of the present invention.

Furthermore, while the present embodiment has explained the example in which the frame structure FS is used, a carrier tape 30 wherein a plurality of resin encapsulater forming areas 2A are repeatedly disposed on one main surface of a flexible film in its longitudinal direction, may be used as a substrate as shown in FIG. 9 (typical plan view). In FIG. 9, reference numerals 31 indicate sprocket holes.

(Second Embodiment)

Figure 10:
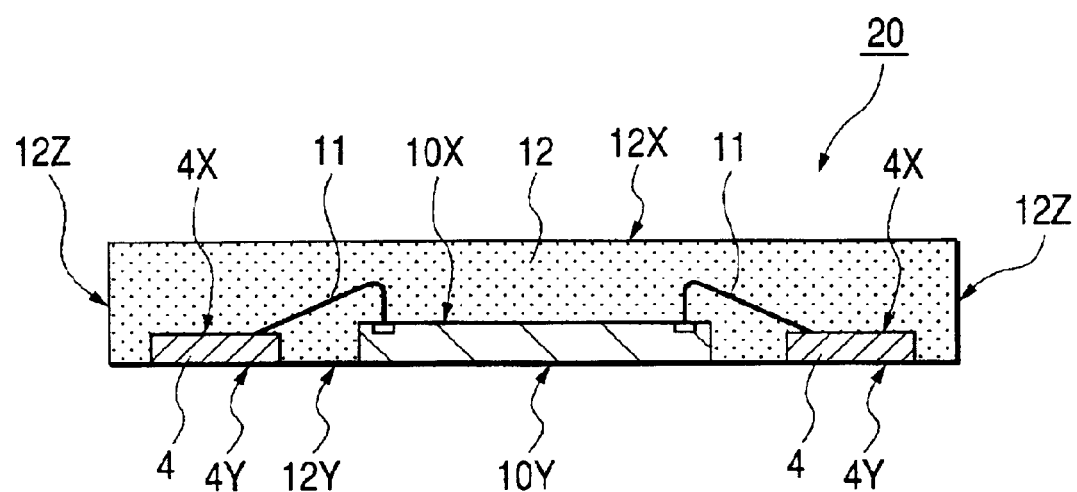
FIG. 10 is a typical cross-sectional view showing a schematic configuration of a semiconductor device illustrating a second embodiment of the present invention.

FIG. 10 is a typical cross-sectional view showing a schematic configuration of a semiconductor device illustrative of a second embodiment of the present invention.

As shown in FIG. 10, the semiconductor device 20 according to the second embodiment is basically identical to the first embodiment in configuration, and the following configuration is different therefrom.

Namely, in the resin encapsulater 12 employed in the first embodiment, the area of the upper surface 12X thereof is smaller than that of the mounting surface 12Y thereof, and the sides 12Z are inclined toward the upper surface 12X and the mounting surface 12Y. On the other hand, in a resin encapsulater 12 employed in the second embodiment, the area of an upper surface 12X and that of the mounting surface 12Y are substantially identical to each other, and sides 12Z are substantially orthogonal to the upper surface 12X and the mounting surface 12Y. The fabrication of the semiconductor device according to the second embodiment will be explained below with reference to FIGS. 11 through 14.

Figure 11A:
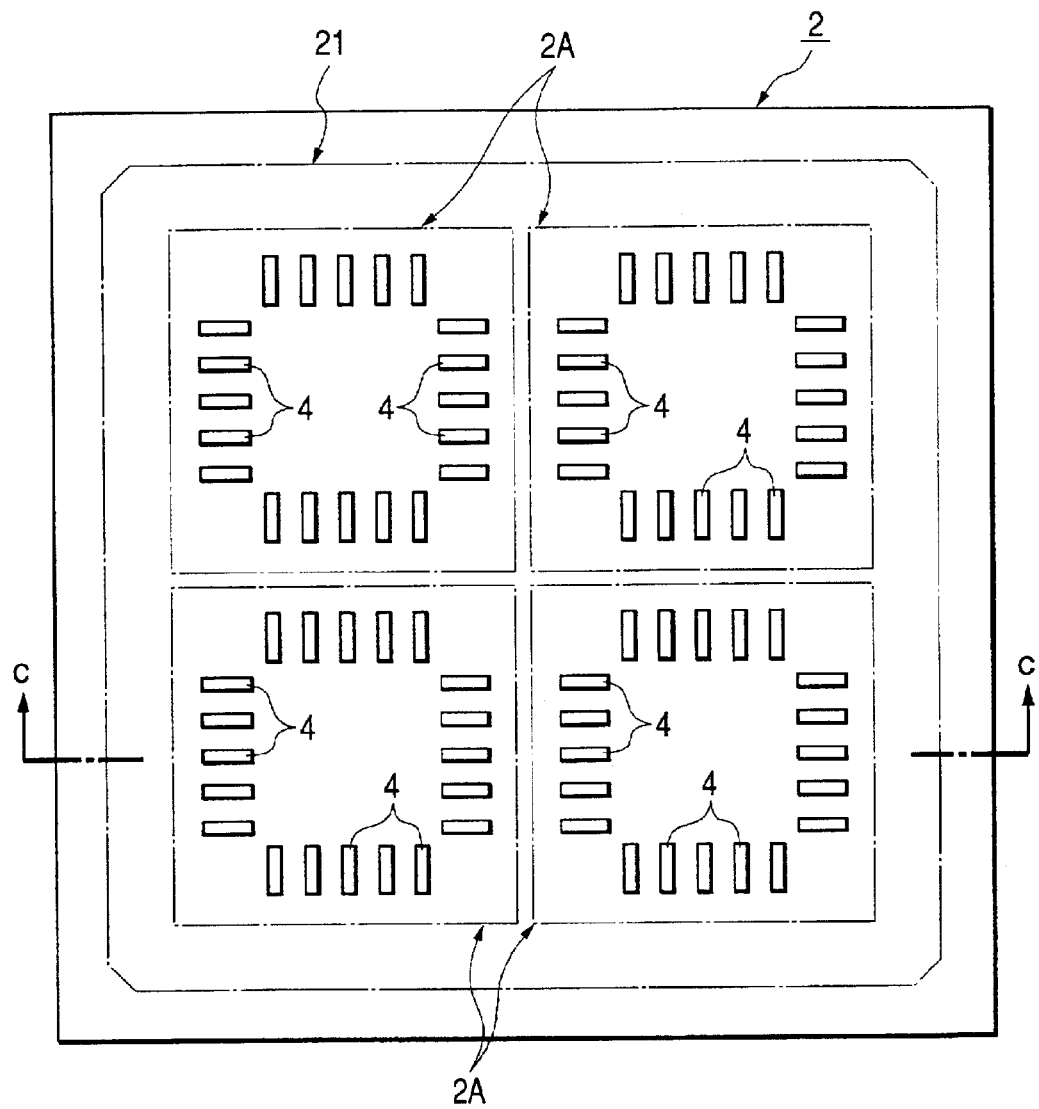
Figure 11B:
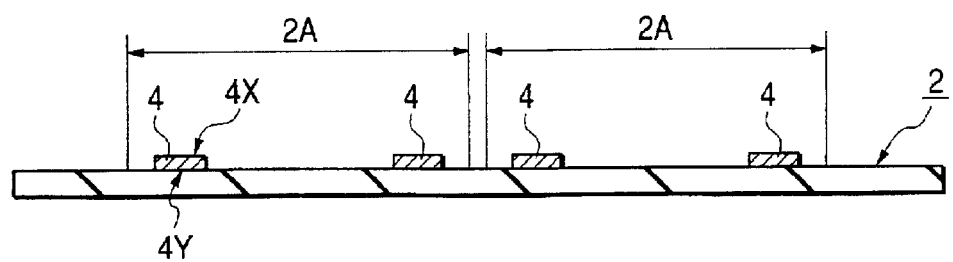

FIGS. 11(A) and 11(B) are diagrams showing a schematic configuration of a substrate employed in the manufacture of the semiconductor device according to the second embodiment, wherein FIG. 11(A) is a typical plan view thereof, and FIG. 11(B) is a typical cross-sectional view taken along line c—c of FIG. 11(A).

Figure 12:
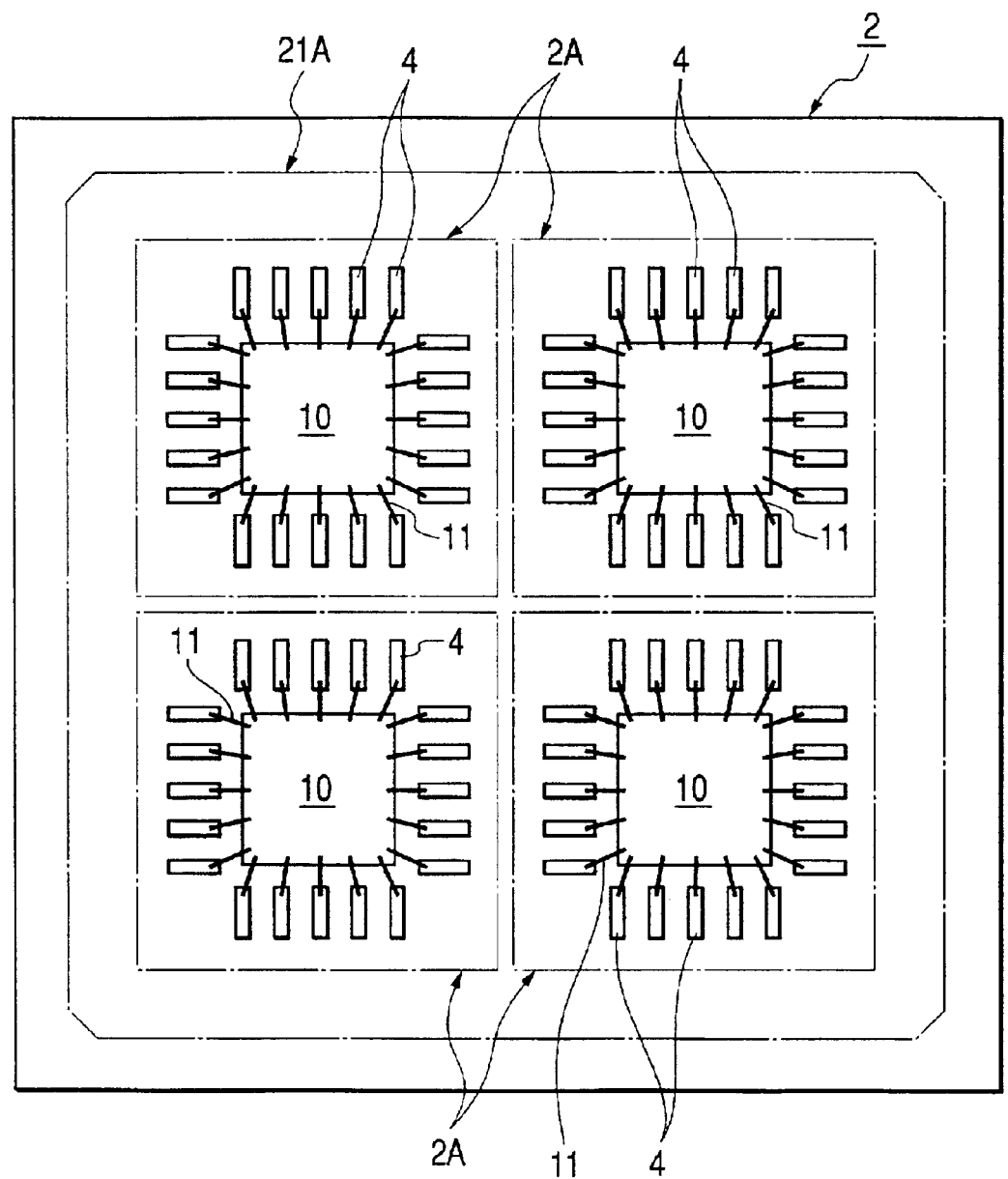
FIG. 12 is a typical plan view for describing the manufacture of the semiconductor device illustrating the second embodiment of the present invention.

FIG. 12 is a typical plan view for describing the manufacture of the semiconductor device according to the second embodiment.

Figure 13A:
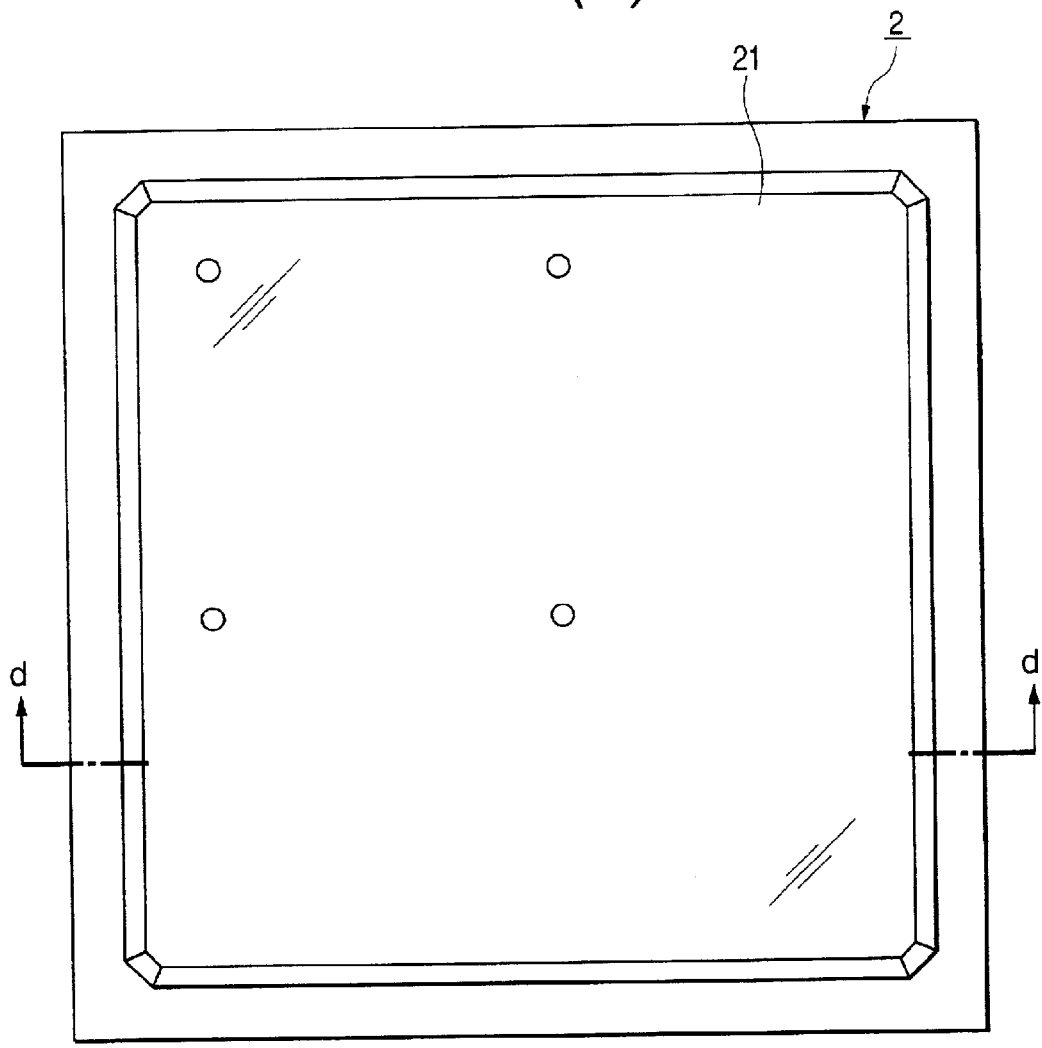
Figure 13B:
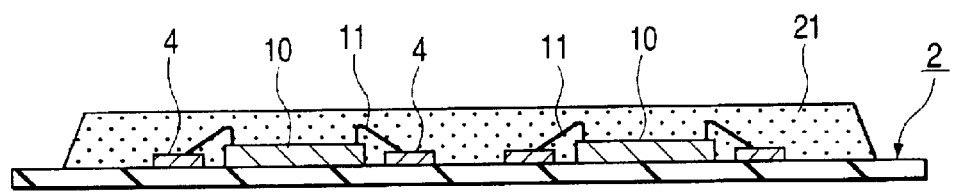

FIGS. 13(A) and 13(B) are diagrams for describing the manufacture of the semiconductor device according to the second embodiment, wherein FIG. 13(A) is a typical plan view thereof, and FIG. 13(B) is a typical cross-sectional view taken along line d—d of FIG. 13(A).

Figure 14A:
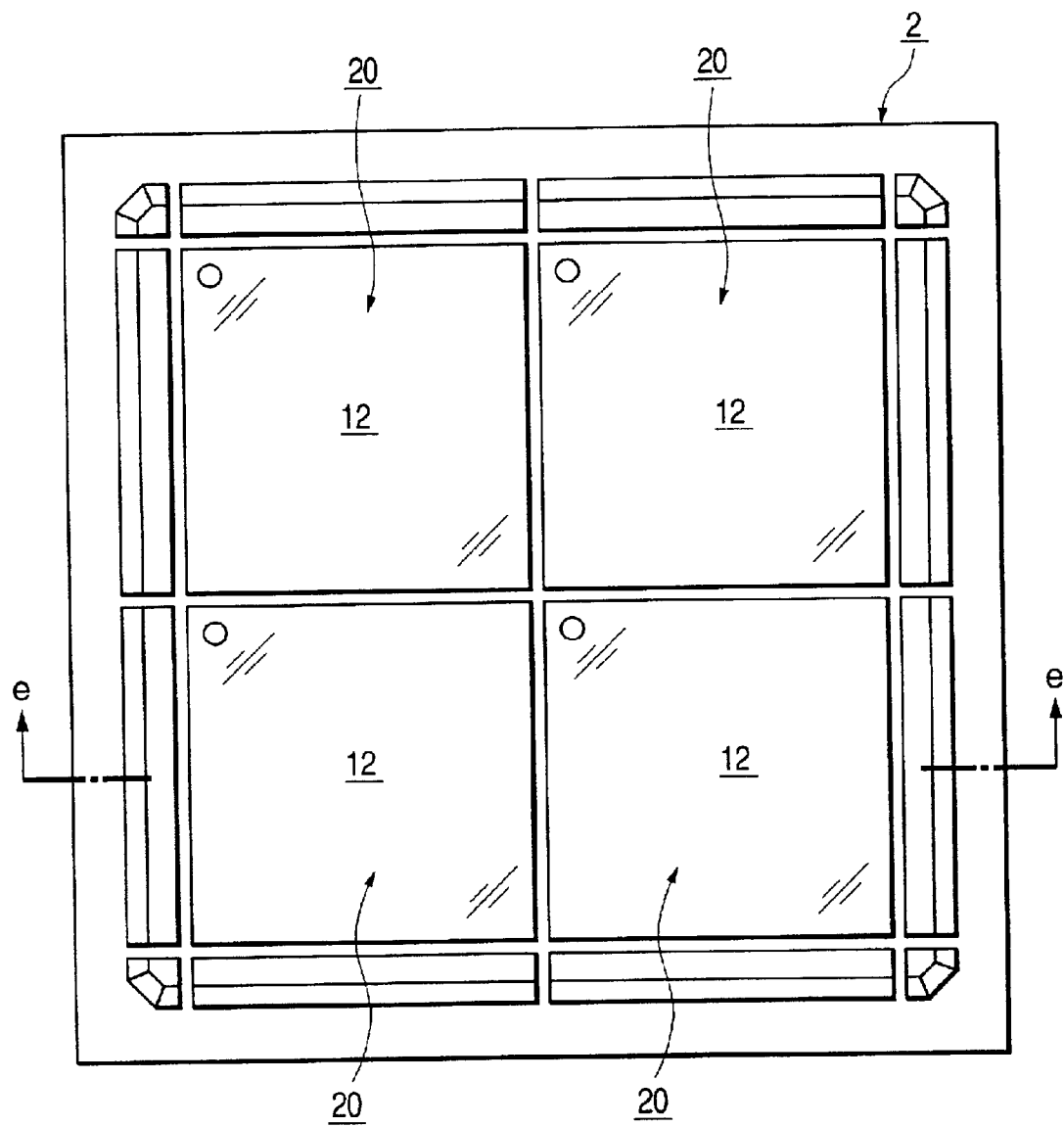
Figure 14B:
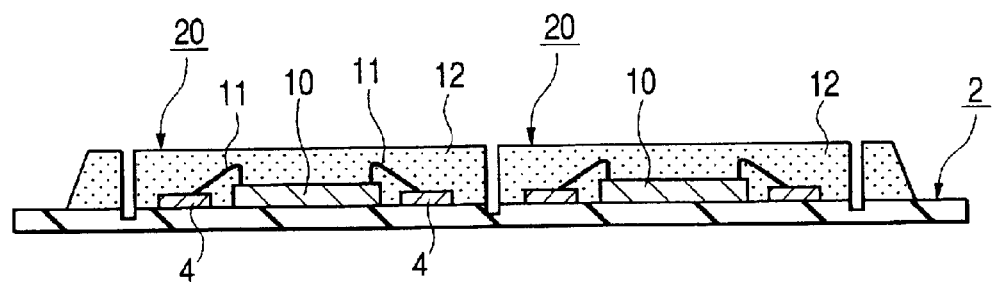

FIGS. 14(A) and 14(B) are diagrams for describing the manufacture of the semiconductor device according to the second embodiment, wherein FIG. 14(A) is a typical plan view thereof, and FIG. 14(B) is a typical cross-sectional view taken along line e—e of FIG. 14(A).

A substrate 2 shown in FIG. 11 is first prepared. The substrate 2 employed in the present embodiment has a plurality of resin encapsulater forming areas 2A and nip-holding areas nipped by a molding die upon formation of resin encapsulaters, both of which are provided on the one main surface side thereof. While the resin encapsulater forming areas 2A are not limited to above in the present embodiment, four are provided by way of example. In each resin encapsulater forming area 2A, a plurality of electrode members 4 individually separated from one another are disposed so as to surround a chip mounting area in a manner similar to the first embodiment. A flexible resin film having an adhesive layer (not shown) provided on one main surface is used as the substrate 2. The plurality of electrode members 4 placed in the respective resin encapsulater forming areas 2A are fixed to the substrate 2 by the adhesive layer formed on the one main surface of the substrate 2.

In order to form a first resin encapsulater for collectively sealing the semiconductor chips and the plurality of electrode members 4 disposed in the respective resin encapsulater forming areas 2A and thereafter divide the first resin encapsulater every resin encapsulater forming areas 2A to thereby form second resin encapsulaters in the present embodiment, the four resin encapsulater forming areas 2A are placed inside a resin encapsulater forming area 21A in which the first resin encapsulater is formed.

Next, the substrate 2 is conveyed to a chip bonding device, where semiconductor chips 10 are mounted on their corresponding mounting areas of the respective resin encapsulater forming areas 2A provided on one main surface of the substrate 2. The respective semiconductor chips 10 have reverse sides 10Y placed in a state of being opposed to the substrate 2 and are fixed to the substrate 2 by the adhesive layer formed on one main surface of the substrate 2.

Next, the substrate 2 is conveyed from the chip bonding device to a wire bonding device, where a plurality of electrodes 10A formed in their corresponding circuit forming surfaces 10X of the semiconductor chips 10, and a plurality of electrode members 4 are respectively electrically connected to one another by a plurality of bonding wires 11 within the respective resin encapsulater forming areas 2A. Process steps up to now are shown in FIG. 12.

Next, the substrate 2 is conveyed from the wire bonding device to a transfer molding device, where a resin encapsulater (first resin encapsulater) 21 for collectively sealing the semiconductor chips 10 and the plurality of electrode members 4 disposed in the respective resin encapsulater forming areas 2A is formed as shown in FIG. 13.

Next, the resin encapsulater 21 is divided every resin encapsulater forming areas 2A to thereby form a plurality of resin encapsulaters 12. The resin encapsulater 21 is divided into them by dicing, for example. According to the present step, each individual semiconductor devices 20 are almost completed.

Thereafter, the semiconductor chips 10 and the plural electrode members 4 are separated from the respective resin encapsulater forming areas 2A of the substrate 2 together with the resin encapsulaters 12, and the respective semiconductor devices 20 are accommodated into a storage tray. The separation thereof from the substrate 2 is carried out by an absorption collet of a pickup device after ultraviolet rays are applied to lower the adhesion of the adhesive layer.

According to the present embodiment, since the substrate 2 having the plurality of resin encapsulater forming areas 2A provided on one main surface thereof and the plurality of individually-separated electrode members 4 disposed in the plurality of resin encapsulater forming areas 2A is used, it is not necessary to cut the electrode members 4 upon dicing the resin encapsulater 21 to thereby form the plural resin encapsulaters 12. Thus, since a blade at its dicing can be made long in life, a QFN type semiconductor device 25 high in productivity can be provided.

According to the present embodiment, the resin encapsulater 21 for collectively sealing the semiconductor chips 10 and the plurality of electrode members 4 disposed within the respective resin encapsulater forming areas 2A on the one main surface of the substrate 2 is formed, and thereafter the resin encapsulater 21 is divided every resin encapsulater forming areas 2A to thereby form the plurality of resin encapsulaters 12. It is therefore unnecessary to define the cavity in the molding die for each resin encapsulater area 2A. Thus, since the cost of the molding die used in the manufacturing process can be curbed, a QFN type semiconductor device 25 low in cost can be provided.

Incidentally, while the present embodiment has described the example in which the four resin encapsulater forming areas 2A are collectively sealed with one resin encapsulater 21, two resin encapsulater forming areas 2A or five or more resin encapsulater forming areas 2A may collectively be sealed with one resin encapsulater 21. However, since the flow of the resin injected under pressure into the cavity becomes complex as the area of the cavity for forming the resin encapsulater 21 increases, it is necessary to pay attention to non-charging and voids or the like.

Further, while the present embodiment has explained the example in which the substrate 2 is conveyed for simplification of illustration, it may be performed by use of the frame structure with each substrate 2 supported by the frame body.

(Third Embodiment)

Figure 15A:
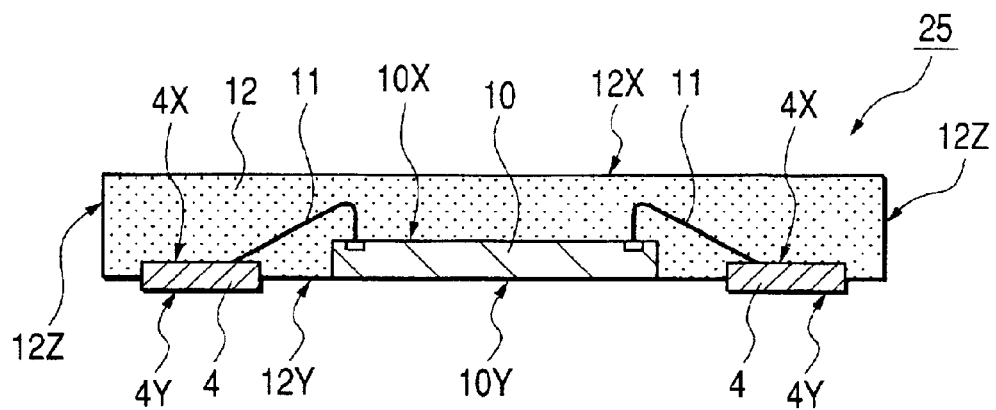
Figure 15B:
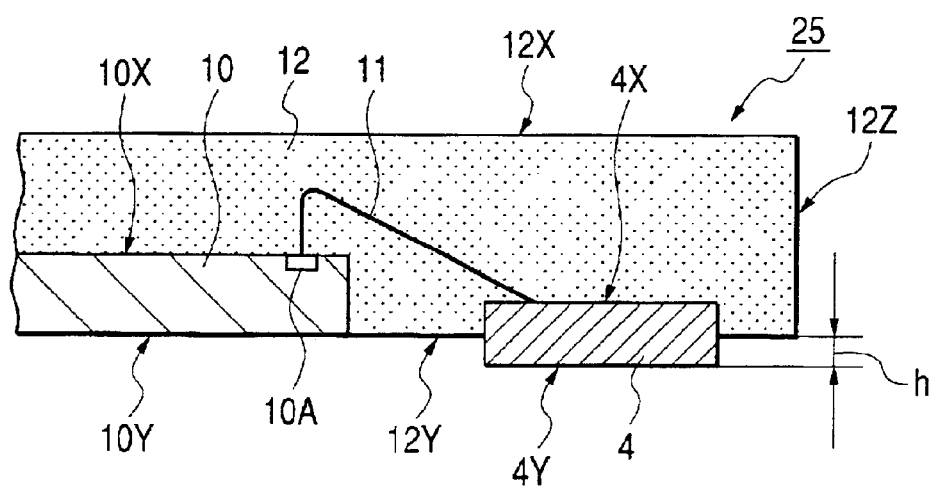

FIGS. 15(A) and 15(B) are diagrams showing a schematic configuration of a semiconductor device according to a third embodiment of the present invention, wherein FIG. 15(A) is a typical cross-sectional view thereof, and FIG. 15(B) is a typical cross-sectional view showing a part of FIG. 15(A) in enlarged form.

As shown in FIG. 15, the semiconductor device 25 according to the third embodiment is basically identical to the second embodiment in configuration and different in the following configuration therefrom.

Namely, the second embodiment has such a configuration that the external connecting surfaces 4Y of the electrode members 4 are located within substantially the same plane as the mounting surface 12Y of the resin encapsulater 12. On the other hand, the third embodiment has such a configuration that external connecting surfaces 4Y of electrode members 4 respectively protrude from a mounting surface 12Y of a resin encapsulater 12. Therefore, when the semiconductor device 25 is implemented on a printed or mounting board by soldering, fillets satisfactory for a soldering material for fixedly securing the electrode members 4 of the semiconductor device 25 to their corresponding connecting terminals of the mounting board are formed. The fabrication of the semiconductor device 25 will be explained below with reference to FIGS. 16 through 20.

Figure 16:
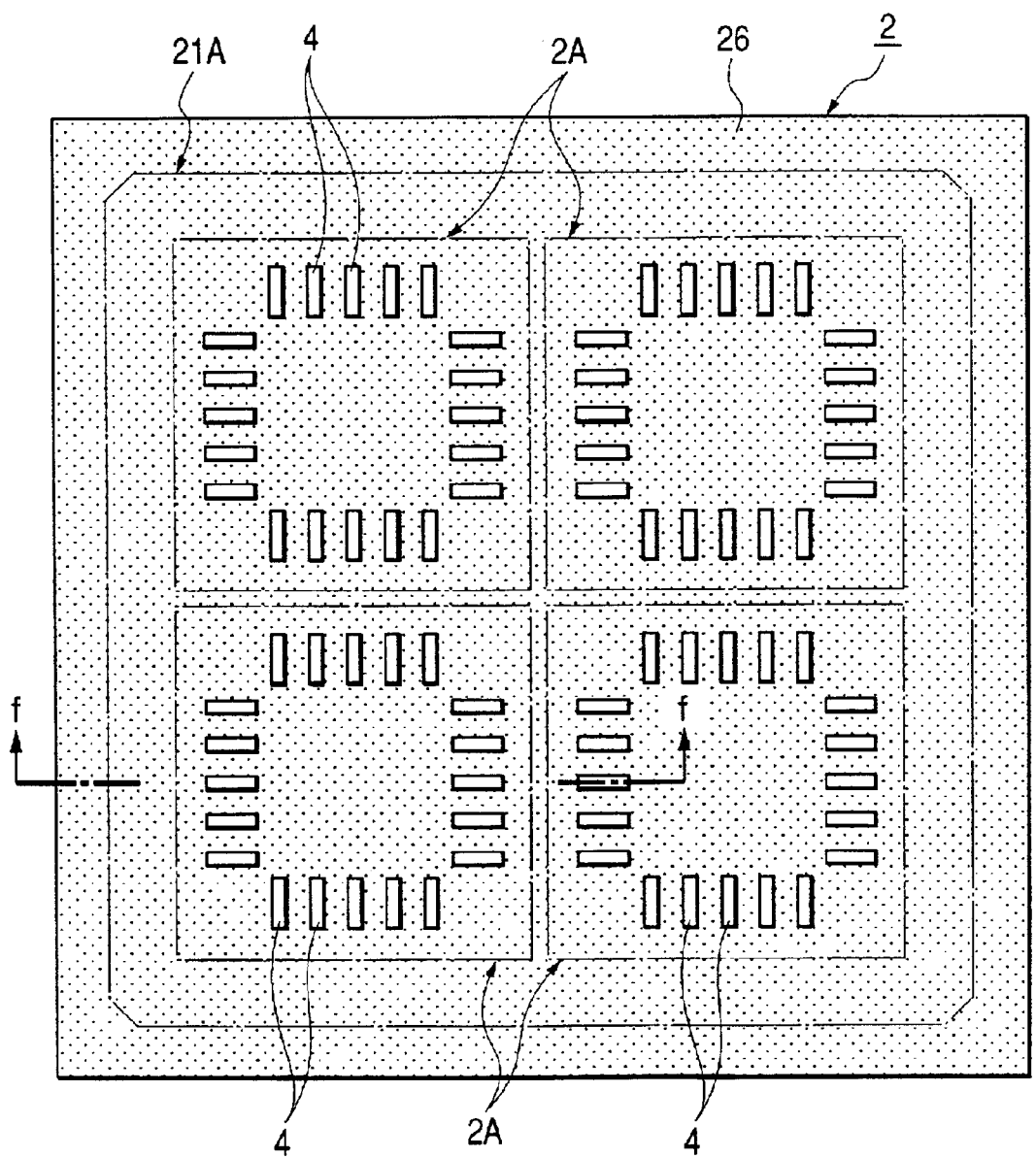
FIG. 16 is a typical plan view showing a schematic configuration of a substrate used in the manufacture of the semiconductor device showing the third embodiment of the present invention.
Figure 17:
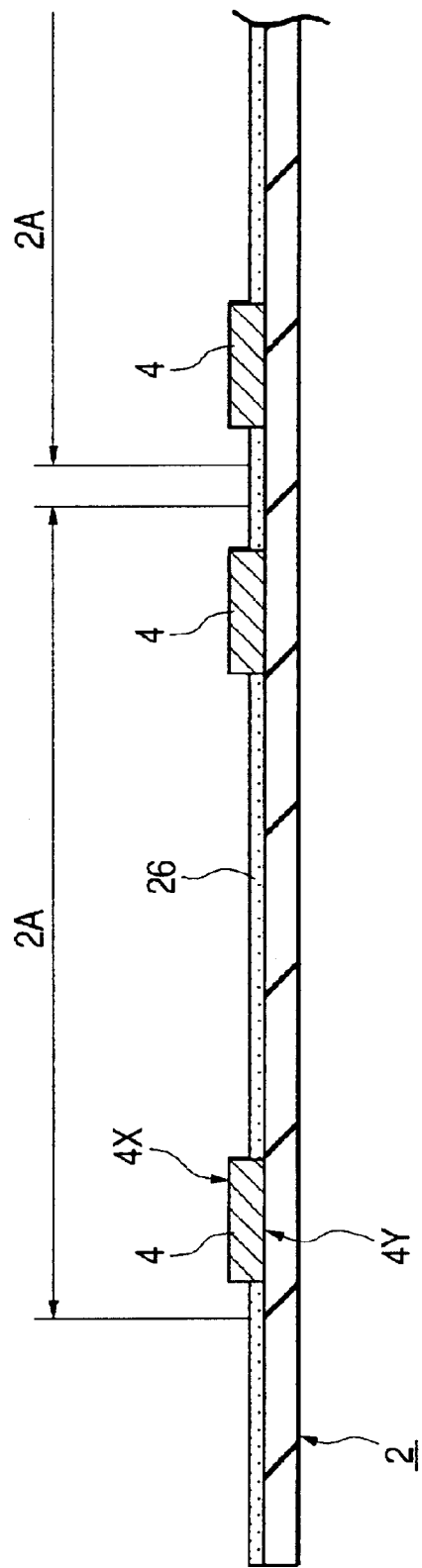
FIG. 17 is a typical cross-sectional view taken along line f—f of FIG. 16.

FIG. 16 is a typical plan view showing a schematic configuration of a substrate used in the manufacture of the semiconductor device according to the third embodiment. FIG. 17 is a typical cross-sectional view taken along line f—f of FIG. 16. FIGS. 18 through 20 are respectively typical cross-sectional views for describing the manufacture of the semiconductor device according to the third embodiment.

A substrate 2 shown in FIGS. 16 and 17 is first prepared. The substrate 2 employed in the present embodiment has, on the main surface side, a plurality of resin encapsulater forming areas 2A, nip-holding areas nipped by a molding die upon formation of each resin encapsulater, a plurality of electrode members 4 individually placed in separated form within the respective resin encapsulater forming areas 2A, and a resin layer 26 which covers the one main surface except for areas in which the plural electrode members 4 are placed, and is formed with a thickness thinner than that of each electrode member 4. In the present embodiment, the resin encapsulater forming areas 2A are provided four, for example. A flexible resin film having an adhesive layer (not shown) provided on one main surface is used as the substrate 2 in a manner similar to the second embodiment. The plurality of electrode members 4 lying within the respective resin encapsulater forming areas 2A are disposed so as to surround chip mounting areas in a manner similar to the second embodiment. The plurality of electrode members 4 placed in the respective resin encapsulater forming areas 2A are fixed to the substrate 2 by the adhesive layer formed on one main surface of the substrate 2.

In the present embodiment, the protruding height h of each electrode member 4 shown in FIG. 15(B) is defined by the thickness of each resin layer 26 in order to selectively remove the resin layers 26 to thereby protrude the electrode members 4 after the first resin encapsulater has been formed on each resin layer 26. The protruding height h of the electrode member 4 can be made high by increasing the thickness of each resin layer 26. However, the excessive increase in the thickness of the resin layer 26 makes it easy to peel off the electrode member 4 from the resin encapsulater, so that the reliability relative to the mounting is rendered low. Excessively decreasing the thickness of the resin layer 26 in reverse yields non-formation of fillets satisfactory for a soldering material at the mounting. Even in this case, the reliability with respect to the mounting is degraded. It is thus necessary to set the thickness of each resin layer 26 in consideration of the thickness of the electrode member 4. When the thickness of the electrode member 4 is less than or equal to 0.3[mm], the thickness of the resin layer 26 may preferably be set to one-half the thickness of the electrode member 4. Since the electrode member 4 having a thickness of about 0.2[mm] is used in the present embodiment, each resin layer 26 is formed with a thickness of about 0.1[mm]. After the electrode members 4 have been placed in the resin encapsulater forming areas 2A on the one main surface of the substrate 2, the resin is applied onto the one main surface of the substrate 2 to thereby form the resin layer 26.

Next, the substrate 2 is conveyed to a chip bonding device, where semiconductor chips 10 are placed in their corresponding areas of the resin layers 26 opposed to the respective resin encapsulater forming areas 2A on the one main surface of the substrate 2. The respective semiconductor chips 10 are fixed to the resin layers 26 by thermo compression bonding in a state in which the backs 10Y thereof are opposite to the resin layers 26, respectively.

Next, the substrate 2 is conveyed from the chip bonding device to a wire bonding device, where a plurality of electrodes 10A formed in their corresponding circuit forming surfaces 10X of the semiconductor chips 10, and a plurality of electrode members 4 are respectively electrically connected to one another by a plurality of bonding wires 11 within the respective resin encapsulater forming areas 2A. Process steps up to now are shown in FIG. 18(A).

Next, the substrate 2 is conveyed from the wire bonding device to a transfer molding device, where a resin encapsulater (first resin encapsulater) 21 for collectively sealing the semiconductor chips 10 and the plurality of electrode members 4 disposed in the respective resin encapsulater forming areas 2A is formed on each resin layer 26 as shown in FIG. 18 (B). The resin encapsulater 21 is formed by a transfer molding method.

Next, as shown in FIG. 19(A), the semiconductor chips 10 and the plural electrode members 4 in the respective resin encapsulater forming areas 2A are separated from the substrate 2 together with the resin encapsulater 21 and the resin layers 26. The separation thereof from the substrate 2 is carried out by an absorption collet of a pickup device after ultraviolet rays are applied to reduce the adhesion of the adhesive layer.

Next, as shown in FIG. 19(B), the resin encapsulater 21 is mounted to an adhesive layer 27A of a dicing sheet 27. The resin encapsulater 21 is mounted thereto in a state in which each resin layer 26 is being turned up.

Figure 20A:
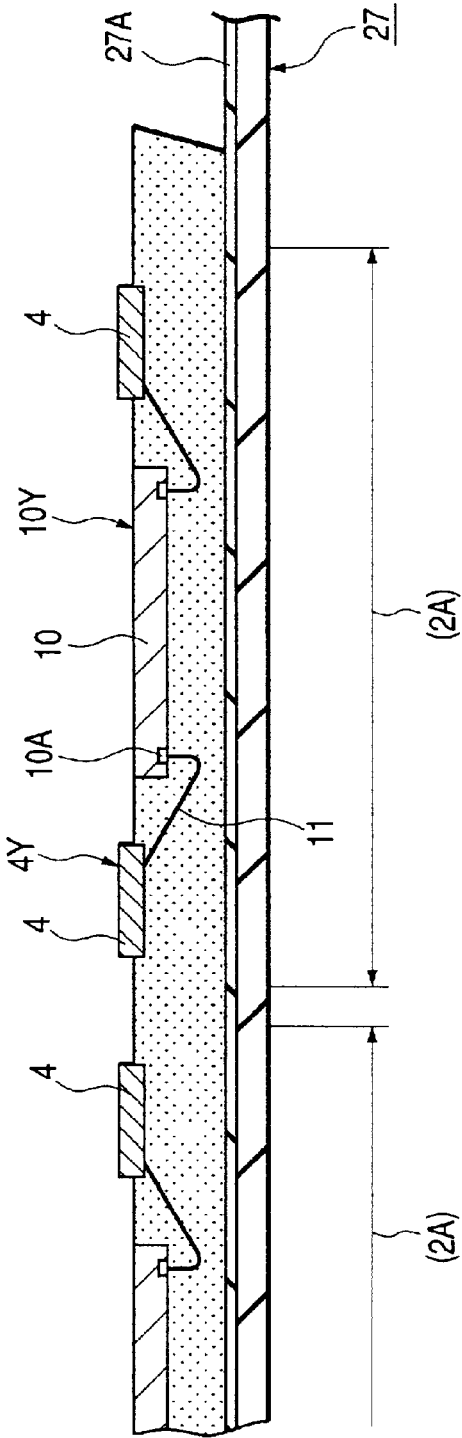
FIG. 20 is a typical cross-sectional view for describing the manufacture of the semiconductor device depicting the third embodiment of the present invention.

Next, as shown in FIG. 20(A), the resin layers 26 are selectively removed. The removal of the resin layers 26 is carried out by means of a wet etching method, for example. In the present step, each electrode member 4 protrudes from the resin encapsulater 21 by a portion equivalent to the thickness of the resin layer 26. Subjecting the electrode members 4 to precious-metal plating such as gold (Au) plating or the like in advance in the present step eliminates the need for masking the electrode members 4 upon etching of each resin layer 26.

Figure 20B:
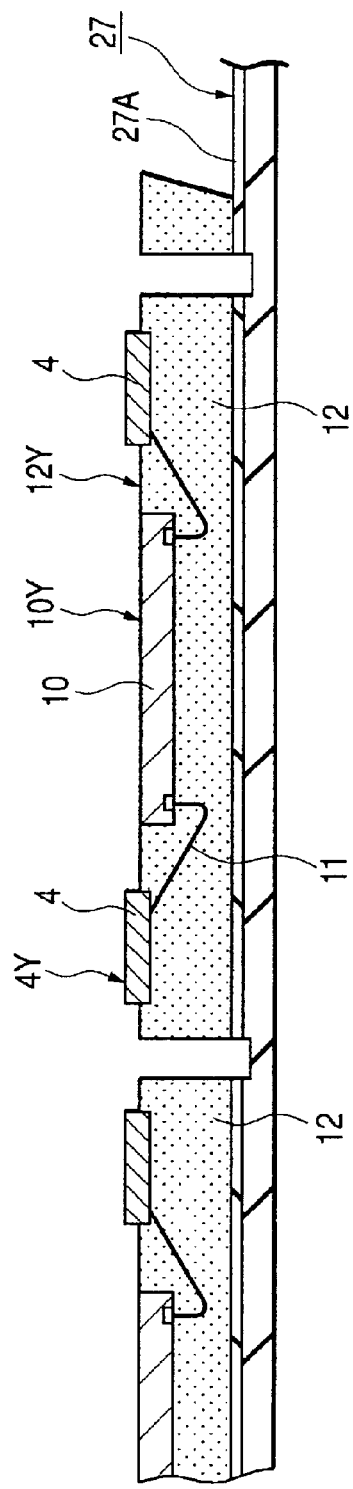

Next, as shown in FIG. 20(B), the resin encapsulater 21 is divided every semiconductor chips 10 (every resin encapsulater forming areas 2A) by a dicing device to thereby form a plurality of resin encapsulaters 12. According to this step, each semiconductor device 25 is almost completed.

Thereafter, the semiconductor devices 25 are separated from the dicing sheet 27 by the absorption collet of the pickup device, followed by storage in a storage tray.

According to the present embodiment, since the resin layers 26 are selectively removed after the formation of the first resin encapsulater 21 on the resin layers 26, the semiconductor devices 25 each having a standoff structure wherein the external connecting surfaces 4Y of the electrode members 4 protrude from the mounting surface 12Y of the resin encapsulater 12, are obtained. Thus, when each of the semiconductor device 25 is implemented on the printed or mounting board by soldering, the fillets satisfactory for the soldering material for fixedly securing the electrode members 4 of the semiconductor device 25 and the connecting terminals of the mounting board are formed. Therefore, a QFN type semiconductor device 25 high in reliability with respect to the mounting or implementation can be offered or provided.

Incidentally, while the present embodiment has described the example in which the substrate 2 is conveyed for simplification of illustration, the frame structure in which the substrate is supported by the frame body, may be used.

Figure 21A:
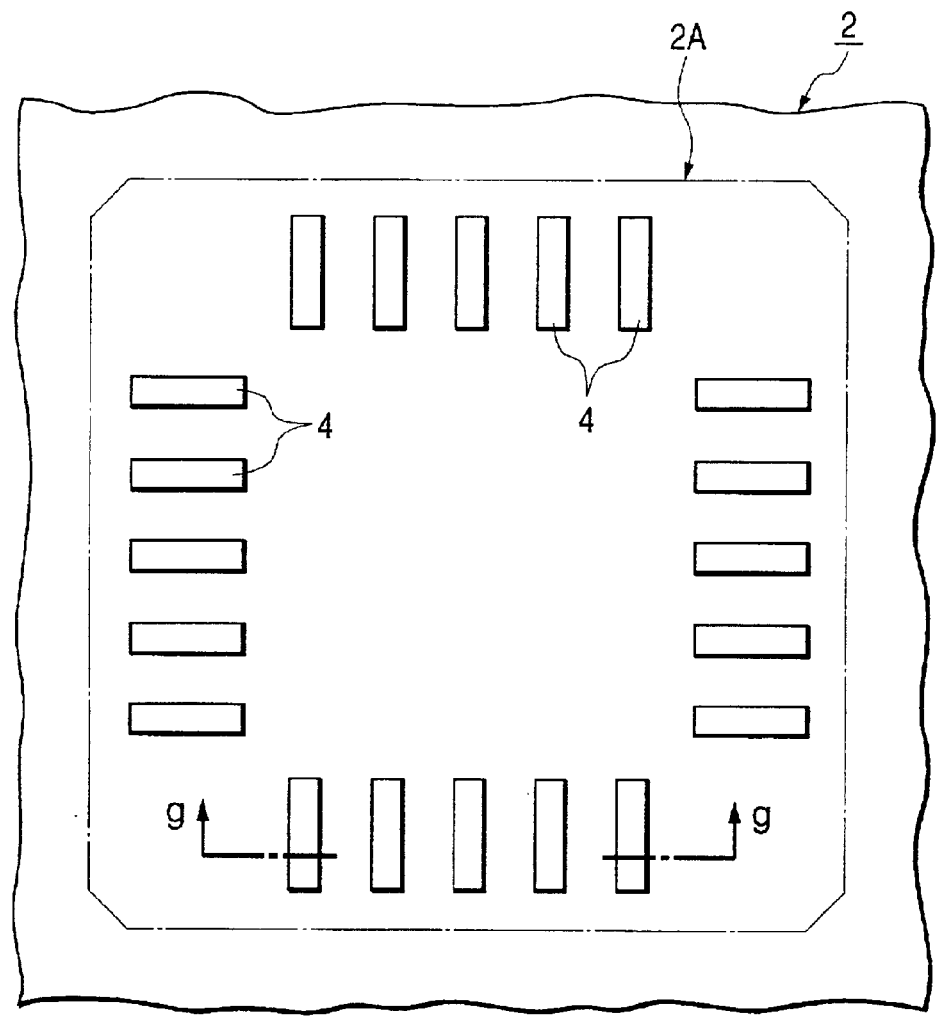
Figure 21B:
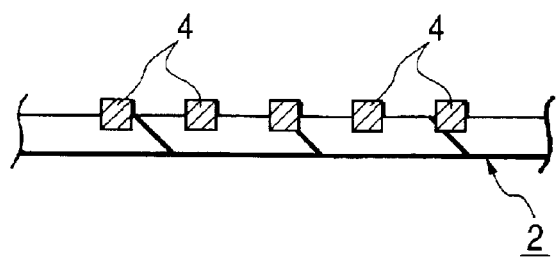

Further, the present embodiment has described the example in which the semiconductor device is fabricated using the substrate 2 with the resin layer 26 formed on one main surface. However, a substrate 2 in which electrode members 4 are embedded therein partly in its depth direction as viewed from one main surface thereof as shown in FIG. 21 (typical plan view and typical cross-sectional view). Even in this case, a semiconductor device 25 having a standoff structure is obtained. Since the electrode members 4 protrude from the resin encapsulater 21 by the separation of the resin encapsulater 21 from the substrate 2, the step for removing the resin layers 26 can be made unnecessary and hence the manufacturing process can be simplified.

(Fourth Embodiment)

Figure 22A:
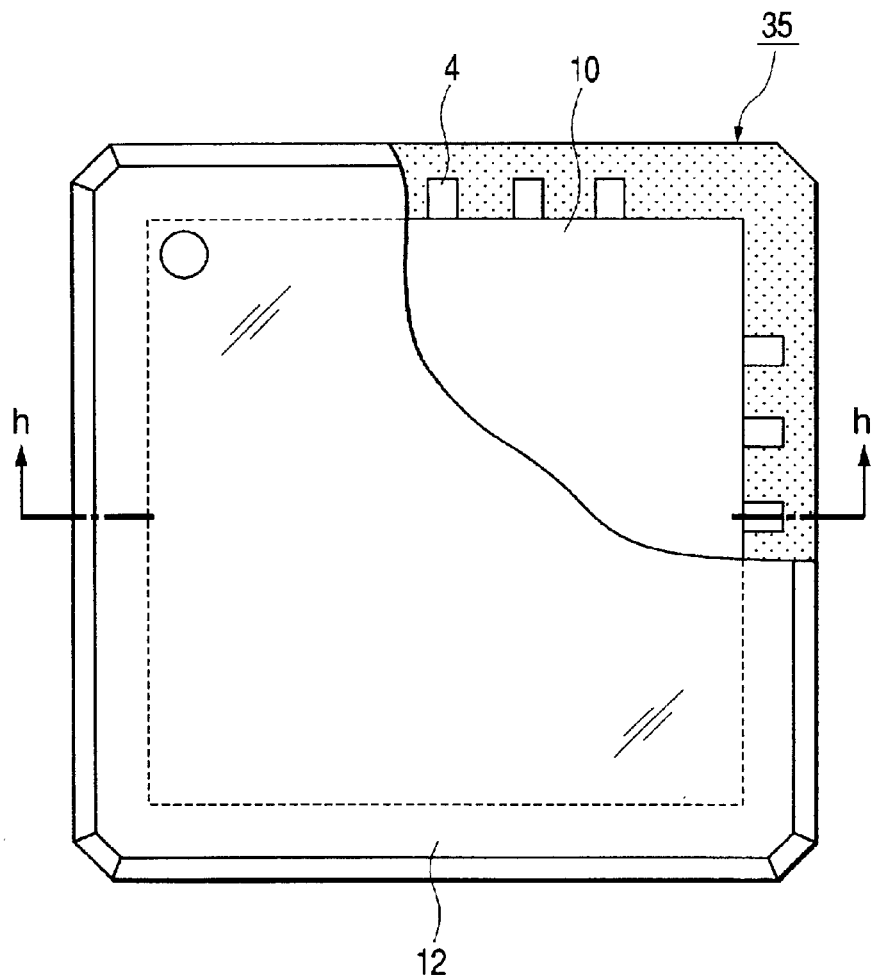
Figure 22B:
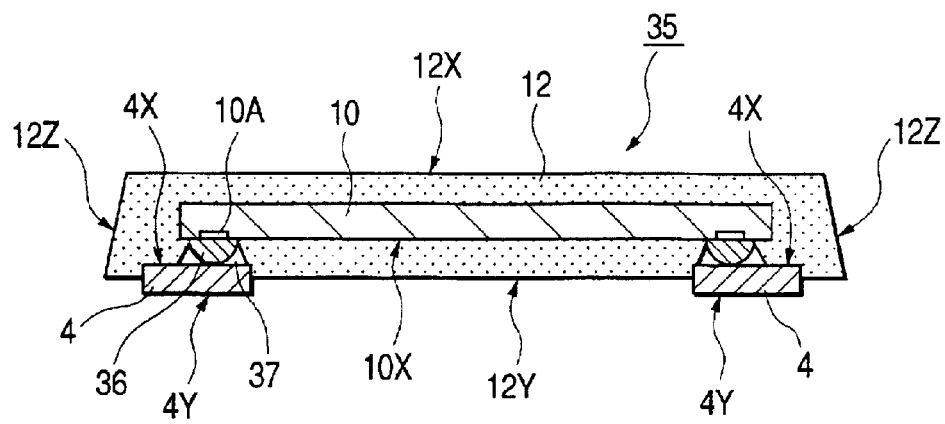
Figure 23:
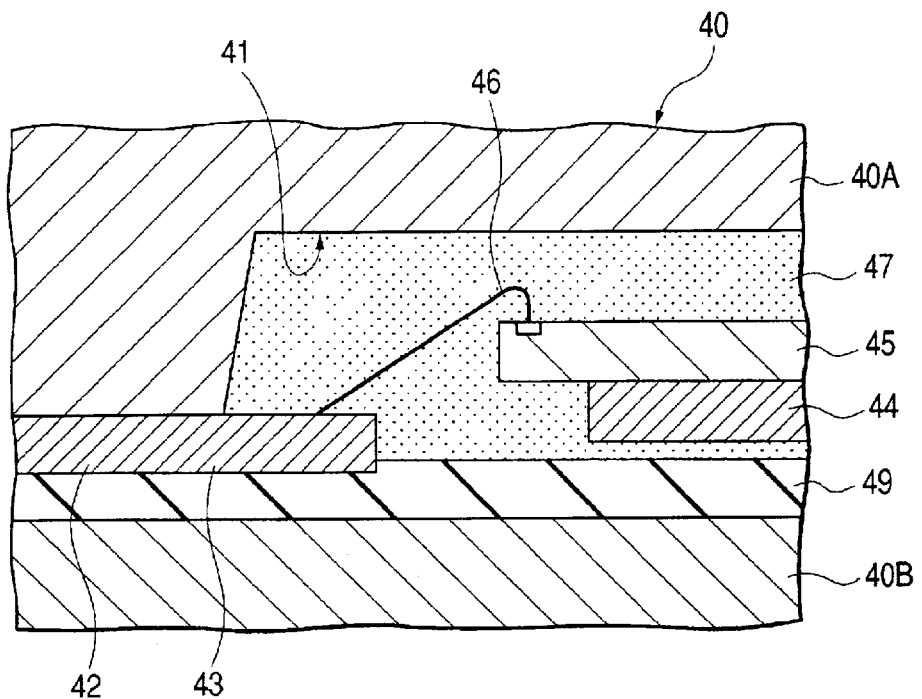
FIG. 23 is a typical cross-sectional view for describing a sealing step upon the manufacture of a conventional QFN type semiconductor device.
Figure 24:
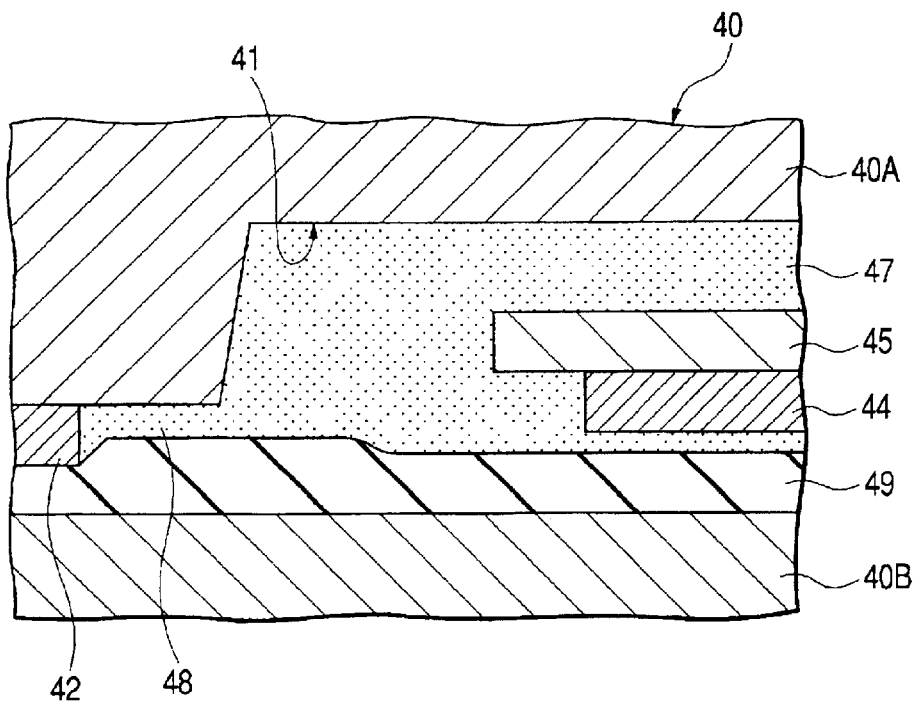
FIG. 24 is a typical cross-sectional view for describing the sealing step upon the manufacture of the conventional QFN type semiconductor device.
Figure 25:
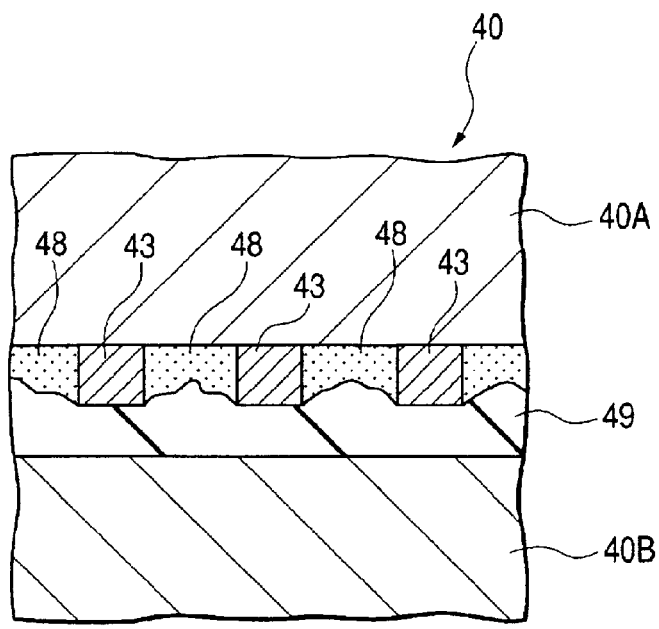
FIG. 25 is a typical cross-sectional view for describing the sealing step upon the manufacture of the conventional QFN type semiconductor device.
Figure 26:
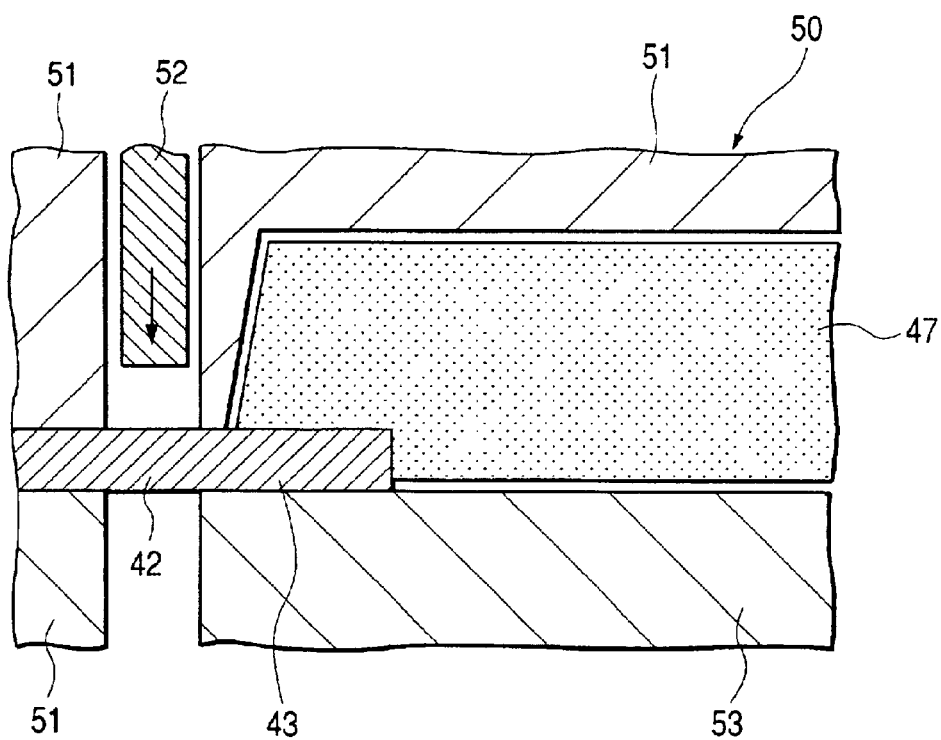
FIG. 26 is a typical cross-sectional view for describing a cutting step subsequent to the sealing step upon the manufacture of the conventional QFN type semiconductor device.
Figure 27:
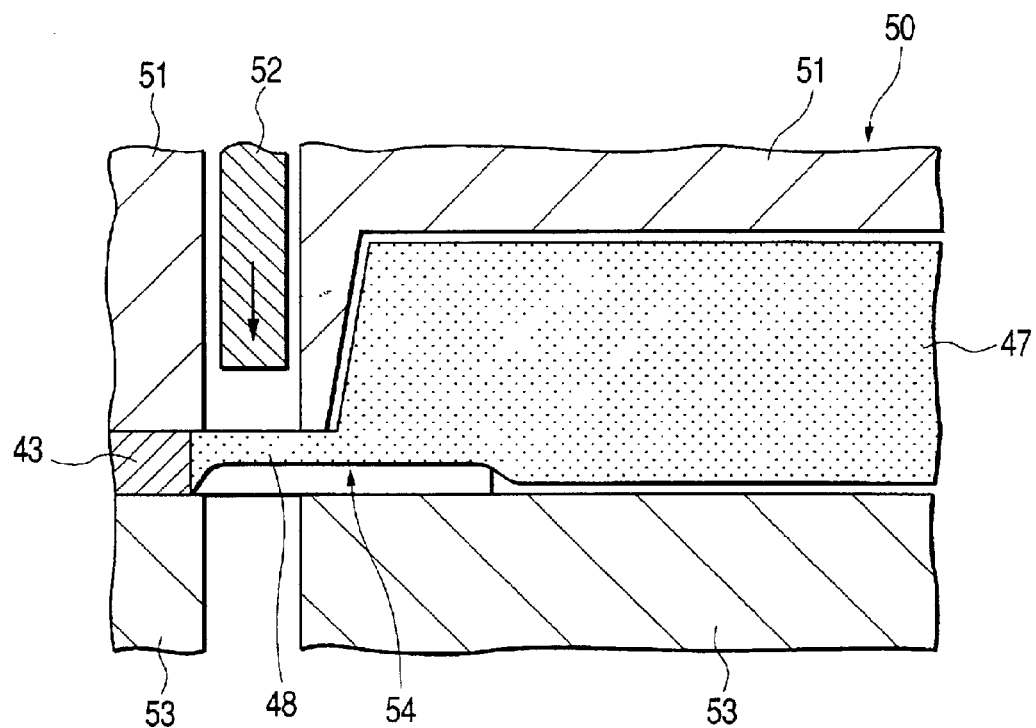
FIG. 27 is a typical cross-sectional view for describing the cutting step subsequent to the sealing step upon manufacture of the conventional QFN type semiconductor device.
Figure 28:
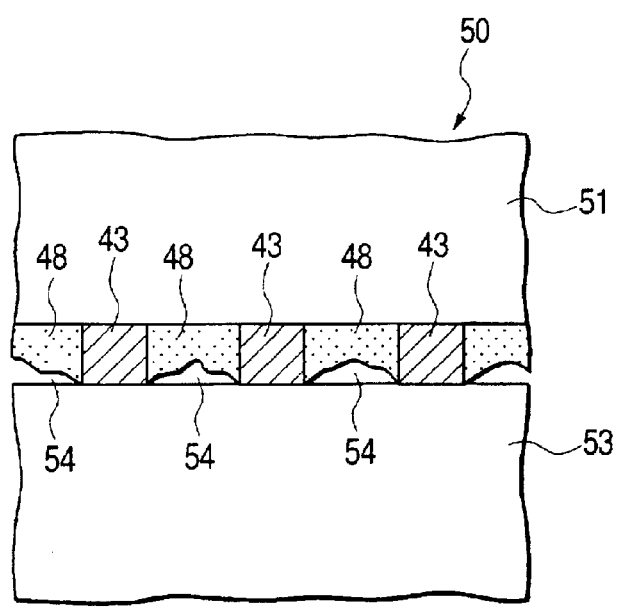
FIG. 28 is a typical cross-sectional view for describing the cutting step subsequent to the sealing step upon the manufacture of the conventional QFN type semiconductor device.

FIGS. 22(A) and 22(B) are diagrams showing a schematic configuration of a semiconductor device illustrating a fourth embodiment of the present invention, wherein FIG. 22(A) is a typical plan view showing a state in which part of a resin encapsulater is removed, and FIG. 22(B) is a typical cross-sectional view taken along line h—h of FIG. 22(A).

As shown in FIG. 22, the semiconductor device 35 according to the present embodiment is basically identical in configuration to the first embodiment, and different in the following configuration therefrom.

Namely, a semiconductor chip 10 has a circuit forming surface 10X sealed in a state of being opposite to internal connecting surfaces 4X of electrode members 4. Electrical connections between electrodes 10A of the semiconductor chip 10 and their corresponding electrode members 4 are carried out by conductive bumps 36 and soldering materials 37.

The manufacture of the semiconductor device 35 according to the present embodiment is slightly different from that described in the first embodiment. In a chip bonding step, the semiconductor chip 10 is placed on one main surface of a substrate in a state in which the circuit forming surface 10X thereof is opposed thereto.

According to the present embodiment, since the electrodes 10A of the semiconductor chip and the electrode members 4 are electrically connected to one another by the conductive bumps 36 and the soldering materials 37, conductive paths between the electrodes 10A of the semiconductor chip and the conductive members 4 become short. Thus, a QFN type semiconductor device 35 can be offered or provided which meets a reduction in on resistance and a high-frequency product.

The invention made above by the present inventors has been described specifically based on the embodiments.

However, the present invention is not limited to the embodiments. It is needless to say that various changes can be made thereto within the scope not departing from the substance thereof.

An advantageous effect obtained by a typical one of the inventions disclosed in the present application will be explained in brief as follows:

According to the present invention, a semiconductor device high in production yield can be provided.

What is claimed is:

1. A method of manufacturing a semiconductor device comprising the steps of:

providing a film substrate having a main surface, a rear surface opposing to the main surface, a plurality of device forming areas of the main surface and electrode members individually separated from one another and formed on the device forming areas;

providing a plurality of semiconductor chips each having a main surface and electrodes formed on the main surface thereof;

arranging the semiconductor chips on respective ones of the device forming areas and electrically connecting the electrodes of the semiconductor chips with electrode members on the respective device forming areas;

forming a resin encapsulator collectively sealing the plurality of device forming areas, the electrode members and the semiconductor chips; and separating the resin encapsulator from the film substrate and thereby revealing the electrode members on one side of the resin encapsulator;

wherein the electrode members are spaced from a side surface of the resin encapsulator.

2. A method of manufacturing a semiconductor device according to claim 1, further comprising a step of cutting the resin encapsulator and the film substrate between adjacent device forming areas by dicing, after the forming step, wherein the cutting step includes a step of sticking dicing tape on another side of the resin encapsulator, wherein the another side is opposed to the one side of the resin encapsulator.

3. A method of manufacturing a semiconductor device according to claim 1, further comprising a step of plating the revealed electrode members, after the step of separating the resin encapsulator.

4. A method of manufacturing a semiconductor device according to claim 3, further comprising a step of cutting the resin encapsulator and the film substrate between adjacent device forming areas by dicing, after the forming step, wherein the plating step is performed before the cutting step.

5. A method of manufacturing a semiconductor device according to claim 1, wherein the film substrate comprises a resin sheet having an adhesive layer on one main surface, and wherein the semiconductor chip and the plurality of electrode members are fixed to the substrate by the adhesive layer.

6. A method of manufacturing a semiconductor device according to claim 2, wherein the film substrate comprises a resin sheet having an adhesive layer on one main surface, and wherein the semiconductor chip and the plurality of electrode members are fixed to the substrate by the adhesive layer.

7. A method of manufacturing a semiconductor device according to claim 3, wherein the film substrate comprises a resin sheet having an adhesive layer on one main surface, and wherein the semiconductor chip and the plurality of electrode members are fixed to the substrate by the adhesive layer.

8. A method of manufacturing a semiconductor device according to claim 4, wherein the film substrate comprises a resin sheet having an adhesive layer on one main surface, and wherein the semiconductor chip and the plurality of electrode members are fixed to the substrate by the adhesive layer.

* * * * *